(12) United States Patent
Yun et al.

(10) Patent No.: US 9,343,452 B2
(45) Date of Patent: May 17, 2016

(54) SEMICONDUCTOR DEVICES HAVING CONDUCTIVE PADS AND METHODS OF FABRICATING THE SAME

(71) Applicants: Tae-Hwan Yun, Suwon-si (KR); Jin-Taek Park, Hwaseong-si (KR)

(72) Inventors: Tae-Hwan Yun, Suwon-si (KR); Jin-Taek Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/542,709

(22) Filed: Nov. 17, 2014

(65) Prior Publication Data

US 2015/0287710 A1 Oct. 8, 2015

(30) Foreign Application Priority Data

Apr. 8, 2014 (KR) ........................ 10-2014-0041916

(51) Int. Cl.
| | |
|---|---|
| *H01L 27/02* | (2006.01) |
| *H01L 23/495* | (2006.01) |
| *H01L 23/522* | (2006.01) |
| *H01L 23/528* | (2006.01) |
| *H01L 27/105* | (2006.01) |

(52) U.S. Cl.
CPC ...... *H01L 27/0207* (2013.01); *H01L 23/49517* (2013.01); *H01L 23/528* (2013.01); *H01L 23/5226* (2013.01); *H01L 27/105* (2013.01)

(58) Field of Classification Search
CPC ..................... H01L 27/0207; H01L 23/49517; H01L 23/5226; H01L 23/528; H01L 27/105
See application file for complete search history.

(56) References Cited

U.S. PATENT DOCUMENTS

| | | | |
|---|---|---|---|
| 8,304,348 B2 | 11/2012 | Hashimoto | |
| 8,395,190 B2 | 3/2013 | Shim et al. | |
| 9,006,884 B2 * | 4/2015 | Lee et al. | ...................... 257/734 |
| 2012/0119283 A1 | 5/2012 | Lee et al. | |
| 2013/0270714 A1 | 10/2013 | Lee et al. | |
| 2013/0334589 A1 * | 12/2013 | Ahn | .............................. 257/324 |

* cited by examiner

*Primary Examiner* — Long Pham
(74) *Attorney, Agent, or Firm* — Myers Bigel & Sibley, P.A.

(57) ABSTRACT

A semiconductor device includes a substrate having a cell region and a connection region. A plurality of gate electrodes is stacked in a vertical direction in the cell region of the substrate. Conductive pads that are electrically connected to a peripheral circuit extend horizontally from the gate electrodes to the connection region. The conductive pads form a cascade structure in the connection region. Contact plugs that have different vertical lengths are electrically connected to respective ones of the conductive pads. The conductive pads have contact portions that are thicker in the vertical direction than the gate electrodes.

10 Claims, 24 Drawing Sheets

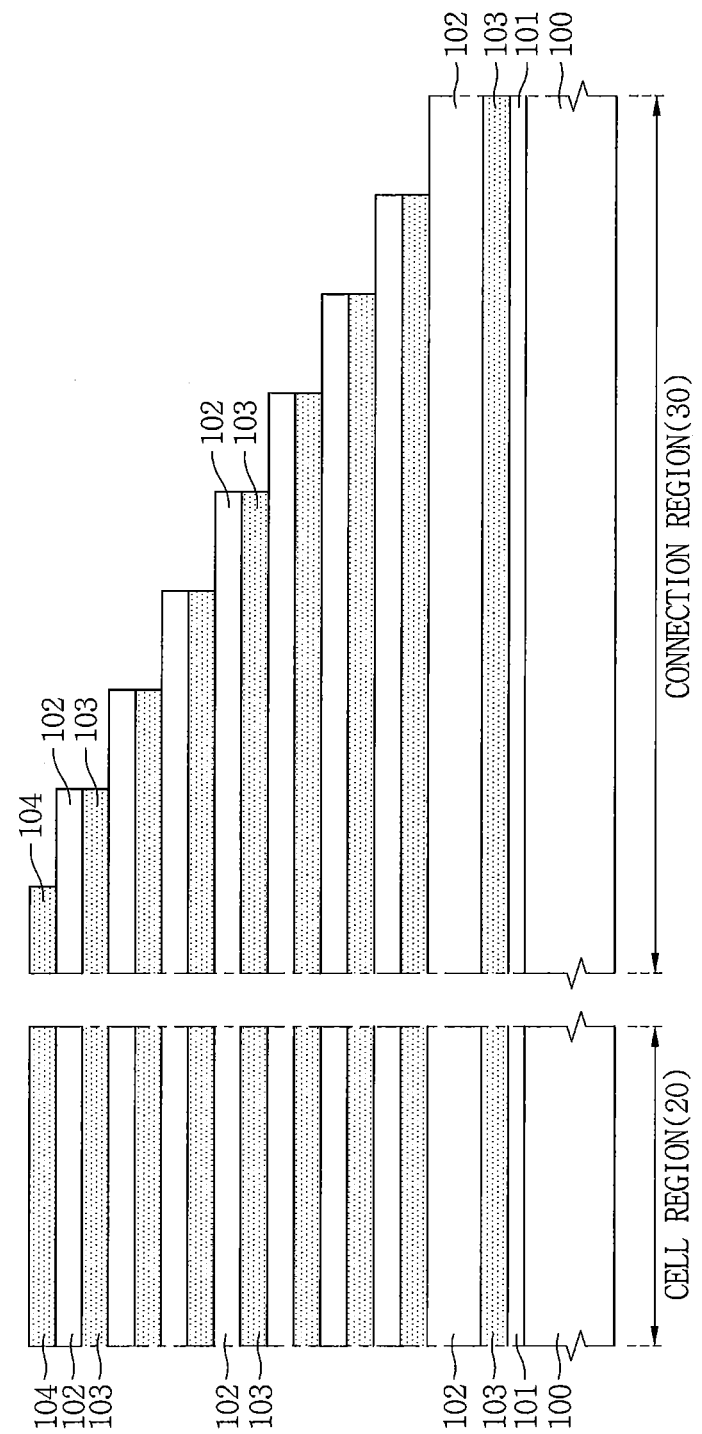

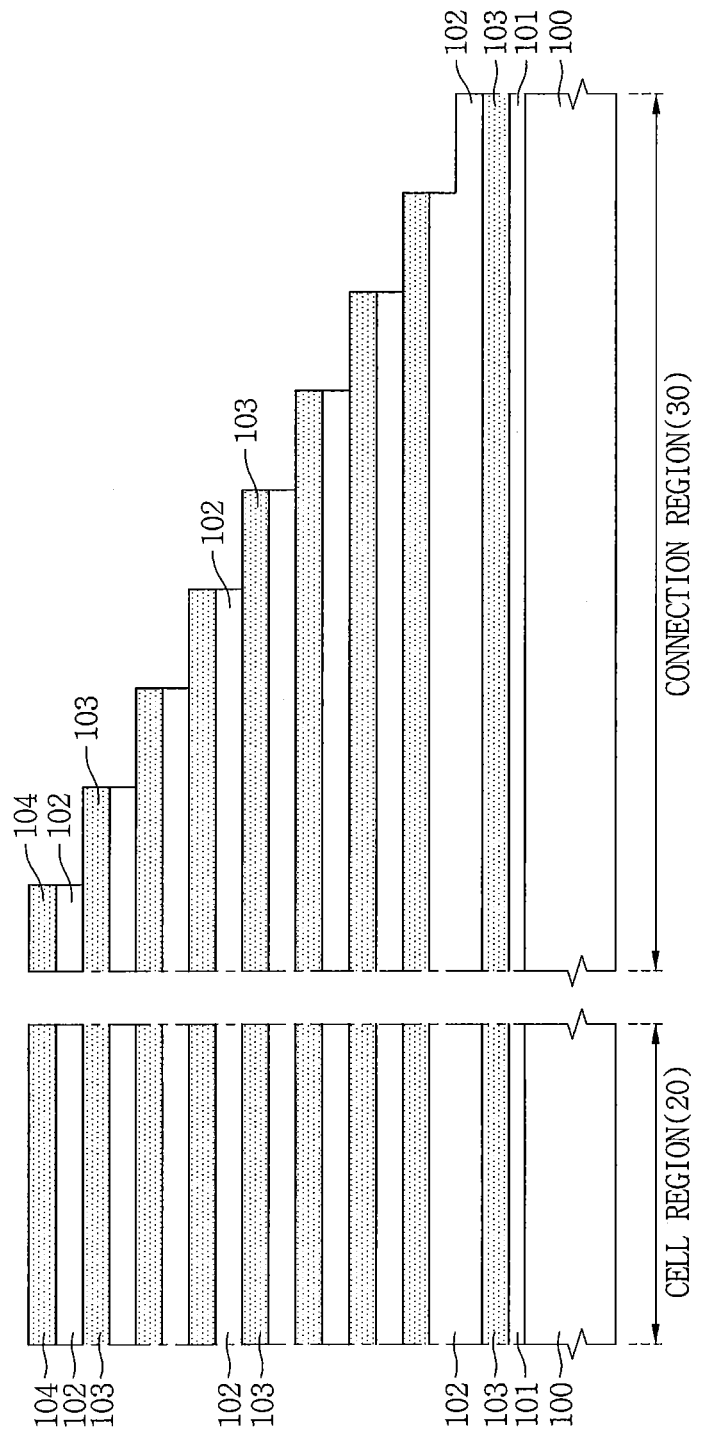

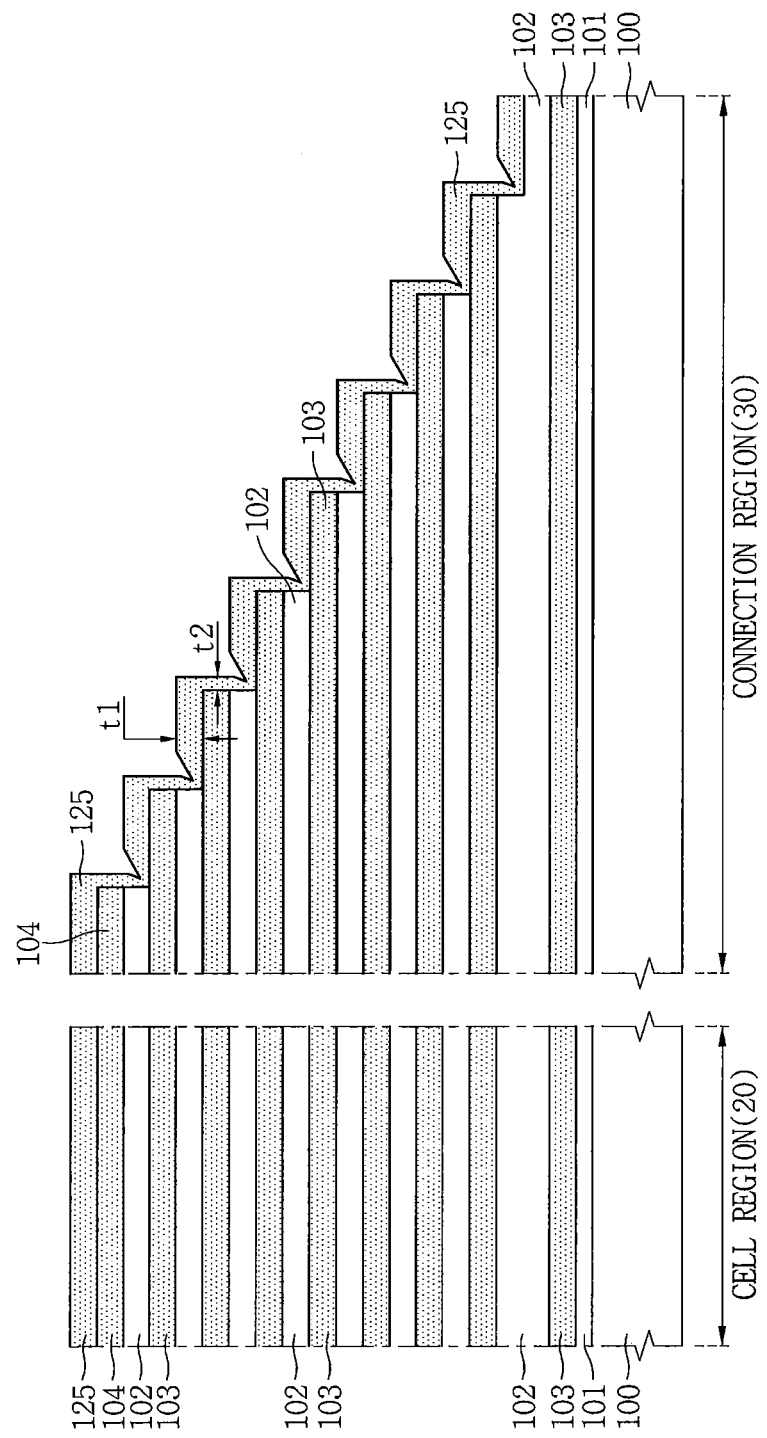

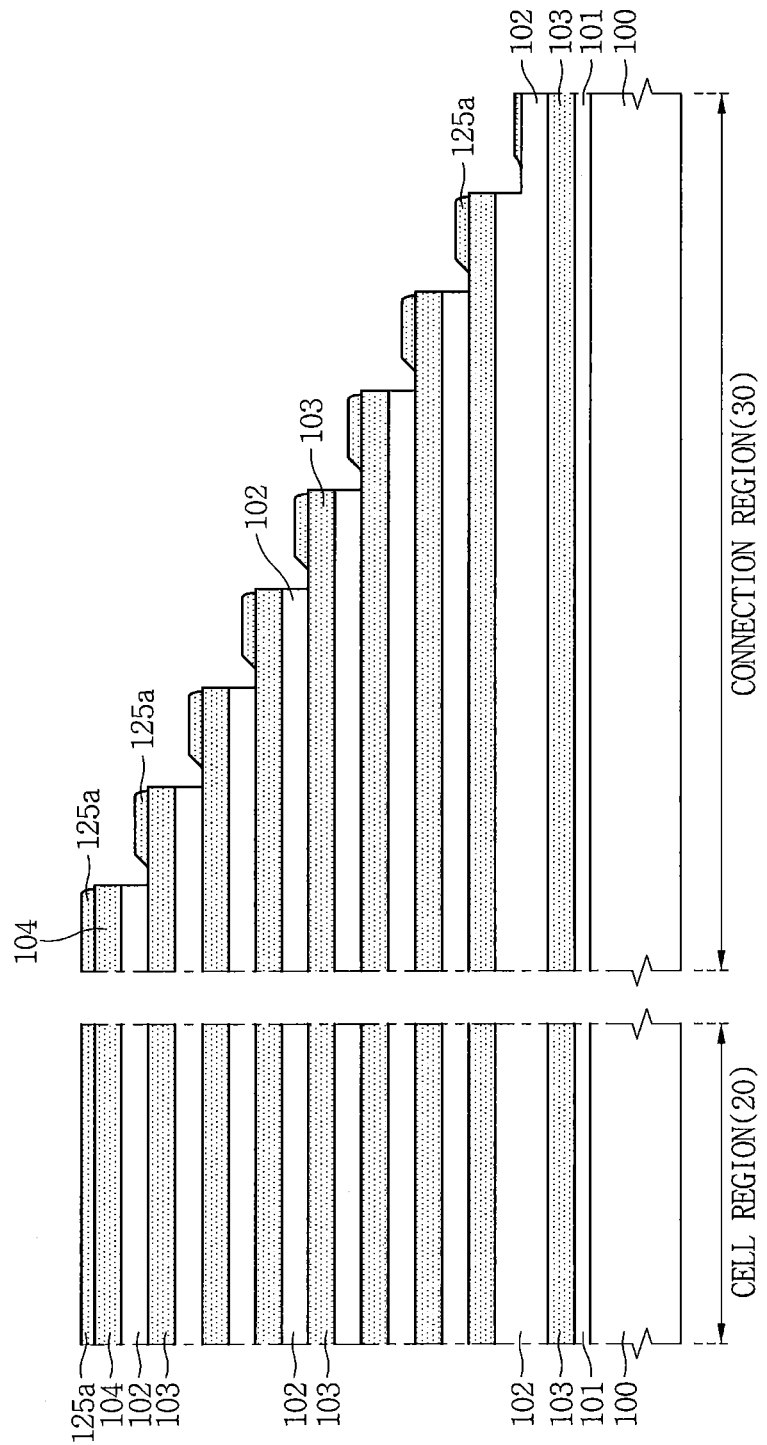

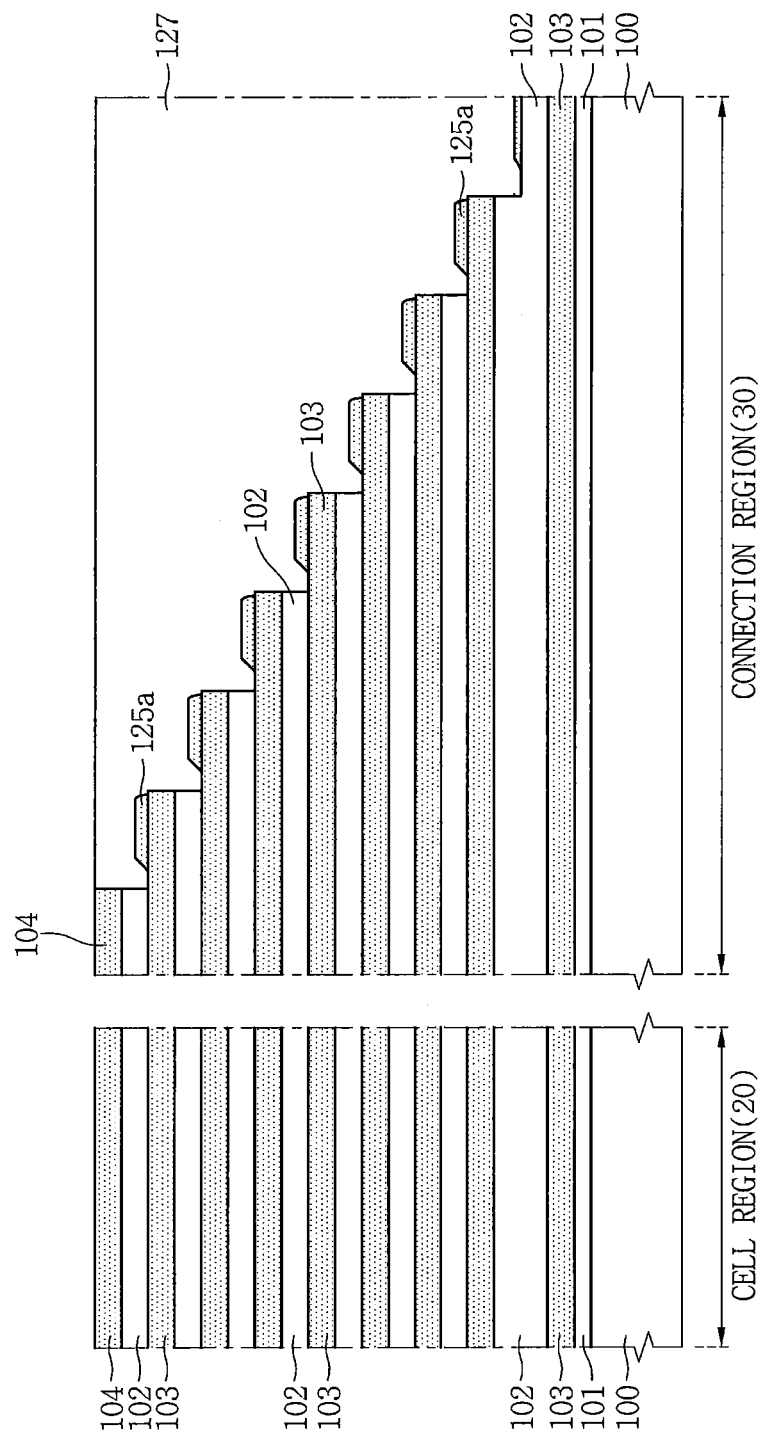

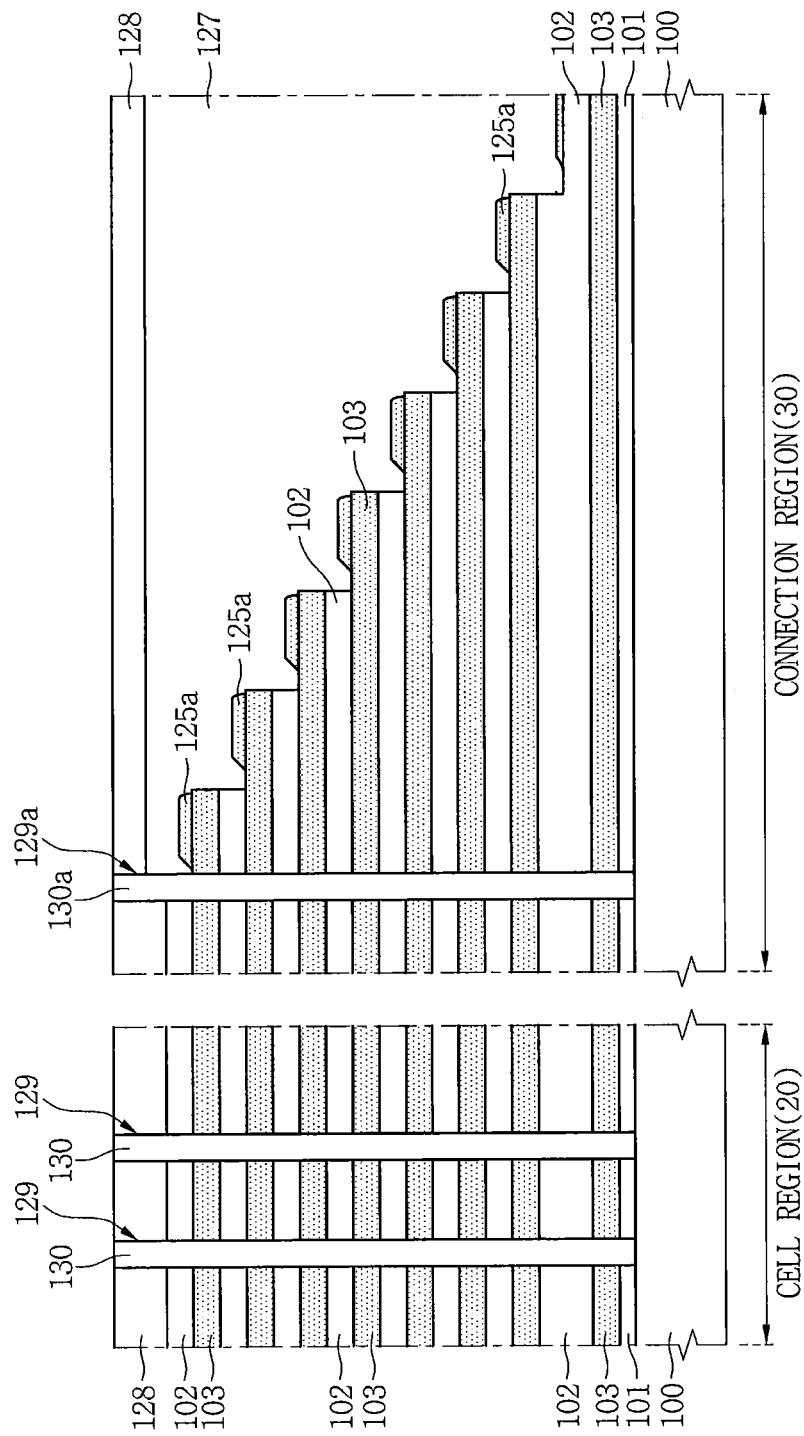

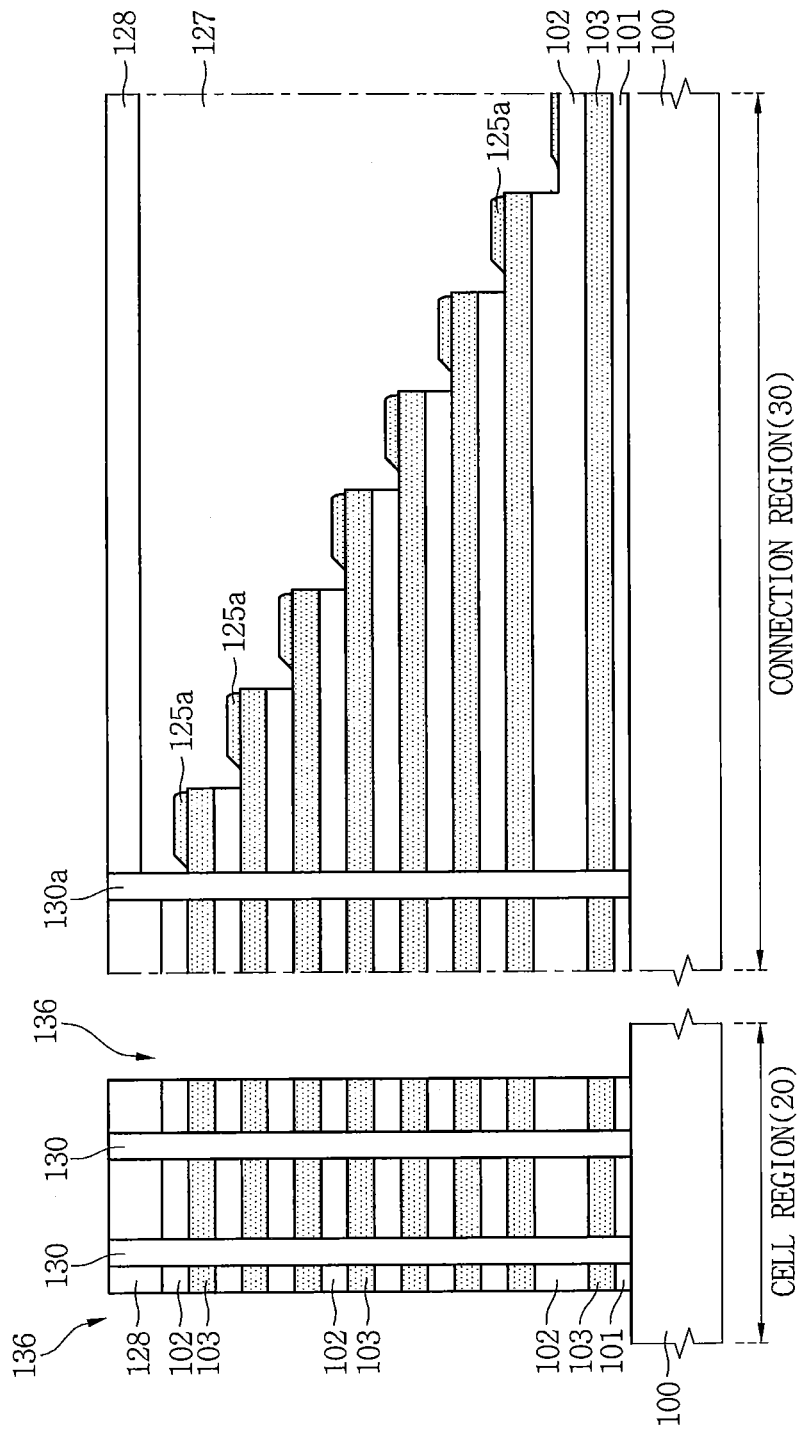

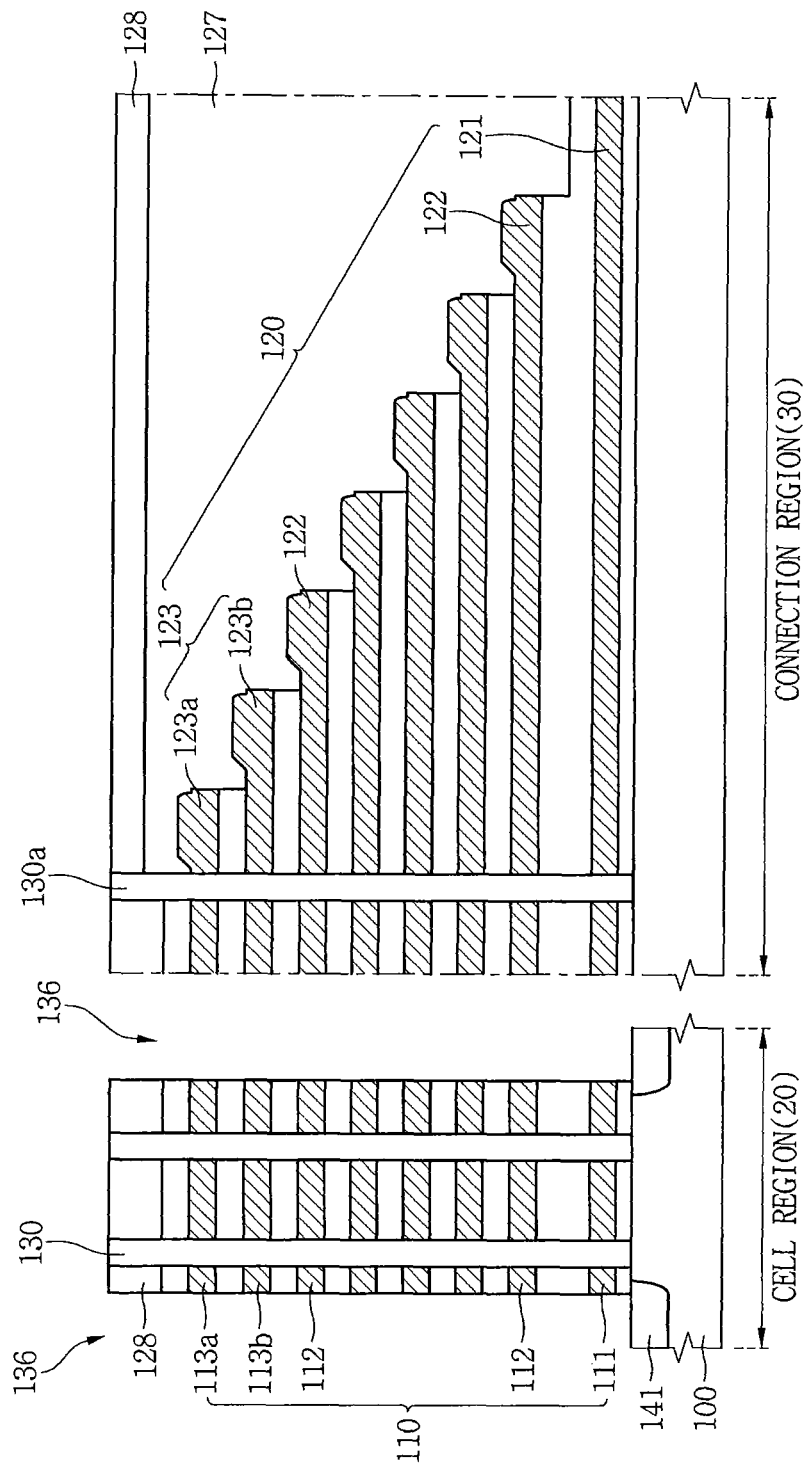

SEMICONDUCTOR DEVICES HAVING CONDUCTIVE PADS AND METHODS OF FABRICATING THE SAME

CROSS-REFERENCE TO RELATED APPLICATION

This application claims priority under 35 U.S.C. §119 to Korean Patent Application No. 10-2014-0041916, filed on Apr. 8, 2014, the disclosure of which is hereby incorporated by reference herein in its entirety.

BACKGROUND

1. Field

Embodiments of the inventive concepts relate to semiconductor devices. More specifically, embodiments of the inventive concepts relate to semiconductor devices that include conductive pads having a portion that are thicker than corresponding gate electrodes, and to methods of fabricating such semiconductor devices.

2. Description of Related Art

Efforts are underway to further increase the integration density of semiconductor devices to improve their performance and/or to decrease the cost of manufacturing these devices. The integration density of a conventional two-dimensional memory device is determined by the area occupied by the unit memory cells of the device, and accordingly, may be influenced by the ability of the fabrication equipment to form fine micropatterns. Unfortunately, the apparatuses necessary to form very fine micropatterns may be expensive, which may limit the ability to highly integrate two-dimensional semiconductor memory devices. Semiconductor devices having three-dimensionally arranged memory cells have been proposed to overcome this limitation.

SUMMARY

Embodiments of the inventive concepts provide a semiconductor device and methods of fabricating this semiconductor device.

Still other embodiments of the inventive concepts provide a connection structure for a semiconductor device that electrically connects vertically stacked electrodes to peripheral circuits and to related methods of fabricating such a connection structure.

Still further embodiments of the inventive concepts provide a semiconductor device including a pad having a contact portion that is thicker than a gate electrode and to related methods of fabricating a semiconductor device having such a pad.

The technical objectives of the inventive concepts are not limited to the above disclosure; other objectives may become apparent to those of ordinary skill in the art based on the following descriptions.

In accordance with an aspect of the inventive concepts, a semiconductor device includes gate electrodes that are stacked in a vertical direction on a substrate, vertical channel structures that penetrate the gate electrodes to electrically connect to the substrate, conductive pads horizontally extending from the respective gate electrodes, and contact plugs that are electrically connected to respective ones of the conductive pads. The conductive pads include portions underneath respective ones of the contact plugs that are thicker in the vertical direction than the gate electrodes.

In accordance with another aspect of the inventive concepts, a semiconductor device includes a substrate including a cell region and a connection region, a plurality of gate electrodes stacked on the substrate in the cell region, and a plurality of conductive pads stacked on the substrate and extending from the respective gate electrodes in the connection region. Horizontal lengths of the conductive pads are greater the closer the conductive pads are to the substrate, and at least some of the conductive pads have portions that are thicker than the gate electrodes.

In some embodiments, one of the conductive pads may include an extension area and a contact area.

In accordance with still another aspect of the inventive concepts, a semiconductor device having a cell region and a connection region includes a substrate, a gate electrode formed in the cell region, and a conductive pad formed in the connection region that extends from the gate electrode. The average thickness of the conductive pad in a vertical direction that is normal to a bottom surface of the substrate is greater than the average thickness of the gate electrode in the vertical direction.

A method of forming a semiconductor device includes alternatively stacking interlayer insulating layers and sacrificial layers on a substrate including a cell region and a connection region, patterning the interlayer insulating layers and the sacrificial layers in the connection region to form a cascade structure in which the sacrificial layers are exposed; forming a sacrificial insulating layer on the cell region and connection region; forming sacrificial insulating patterns on the sacrificial layers exposed on the cascade structure by partially etching the sacrificial insulating layer; forming vertical channel structures in the cell region at the same time as forming dummy pillars in the connection region, forming trenches by continuously sequentially patterning the interlayer insulating layers and the sacrificial layers; forming gap areas by removing the sacrificial layers and the sacrificial insulating patterns in the cell region and the connection region, and forming gate electrodes and conductive pads that are alternatively stacked on the substrate by filling the gap areas with a conductive layer. Contact portions of the conductive pads are thicker in a vertical direction than the gate electrodes.

In accordance with still another aspect of the inventive concepts, a three-dimensional semiconductor device having a first region and a second region is provided that includes a substrate having a top surface and a bottom surface that is separated from the top surface in a vertical direction and a plurality of conductive pads and a plurality of insulating layers that are alternately stacked on the second region of the substrate in the vertical direction, the conductive pads extending horizontally from the first region. Each conductive pad, except for the lowermost conductive pad, extends a shorter horizontal distance from the first region than the conductive pad that is immediately beneath it so as to expose an end portion of the conductive pad that is immediately beneath it. At least part of the exposed end portion of at least some of the conductive pads have a thickened contact portion that is thicker in the vertical direction than portions of those conductive pads that are covered by other of the conductive pads.

Details of other embodiments are included in the detailed description and drawings.

DETAILED DESCRIPTION OF THE EMBODIMENTS

Figure 1:
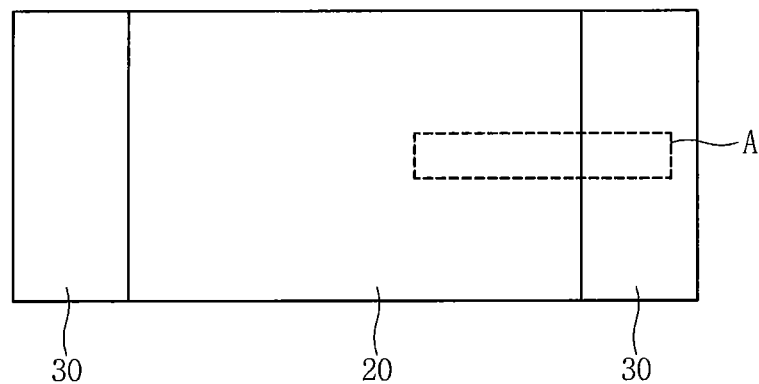
FIG. 1 is a plan view of a semiconductor device in accordance with an embodiment of the inventive concepts.

Various embodiments of the inventive concepts will now be described more fully with reference to the accompanying drawings in which some embodiments are shown. It will be appreciated, however, that the inventive concepts may be embodied in different forms and should not be construed as limited to the example embodiments set forth herein. Rather, these example embodiments are provided so that this disclosure is thorough and complete and fully conveys the inventive concepts to those skilled in the art.

The terminology used herein to describe embodiments of the inventive concepts is not intended to limit the scope thereof. The articles "a," "an," and "the" are singular in that they have a single referent; however, the use of the singular form in the present document should not preclude the presence of more than one referent. In other words, elements referred to in the singular form herein may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. In the drawings, the sizes and relative sizes of layers and regions may be exaggerated for clarity.

Embodiments of the inventive concepts are described herein with reference to cross-sectional and planar illustrations that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Like numerals refer to like elements throughout the specification. Accordingly, the same numerals and similar numerals can be described with reference to other drawings, even if not specifically described in a corresponding drawing.

FIG. 1 is a plan view of a semiconductor device in accordance with an embodiment of the inventive concepts.

Referring to FIG. 1, the semiconductor device may include a memory cell array 10 in which memory cells are arranged, and a peripheral circuit (not shown) that has functional circuits which operate the memory cells. The memory cell array 10 may include a cell region 20 and at least one connection region 30 that is adjacent the cell region 20. The memory cells may be three-dimensionally arranged in the cell region 20, and structures connecting the memory cells to the functional circuits are arranged in the connection region 30. In the depicted embodiment of the inventive concepts, the connection region 30 is provided two sides of the cell region 20, but it will be appreciated that in other embodiments the connection region 30 may be on only one side of the cell region 20 or on more than two sides of the cell region 20.

Figure 2:
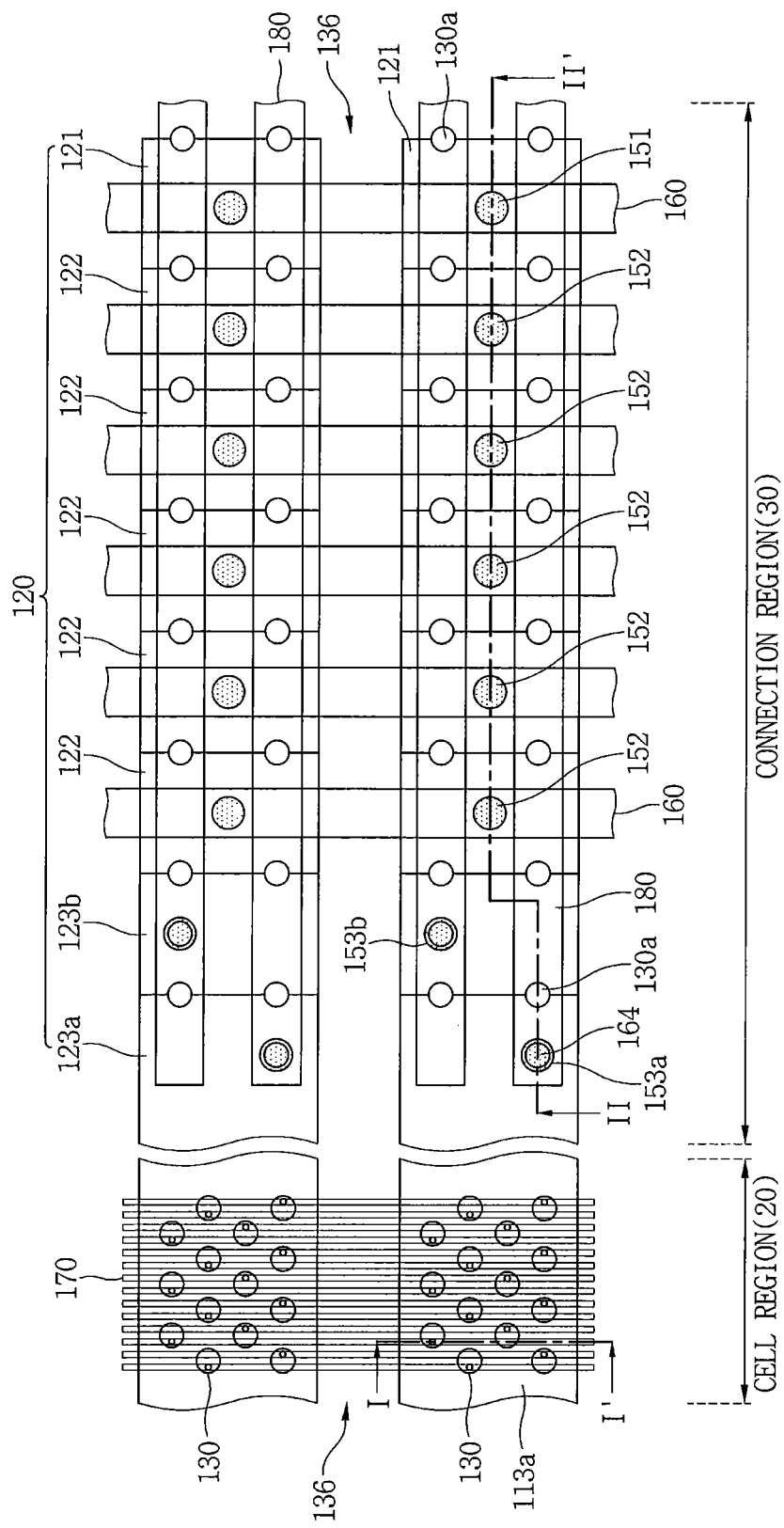
FIG. 2 is an enlarged view of the area labeled A in FIG. 1.
Figure 3:
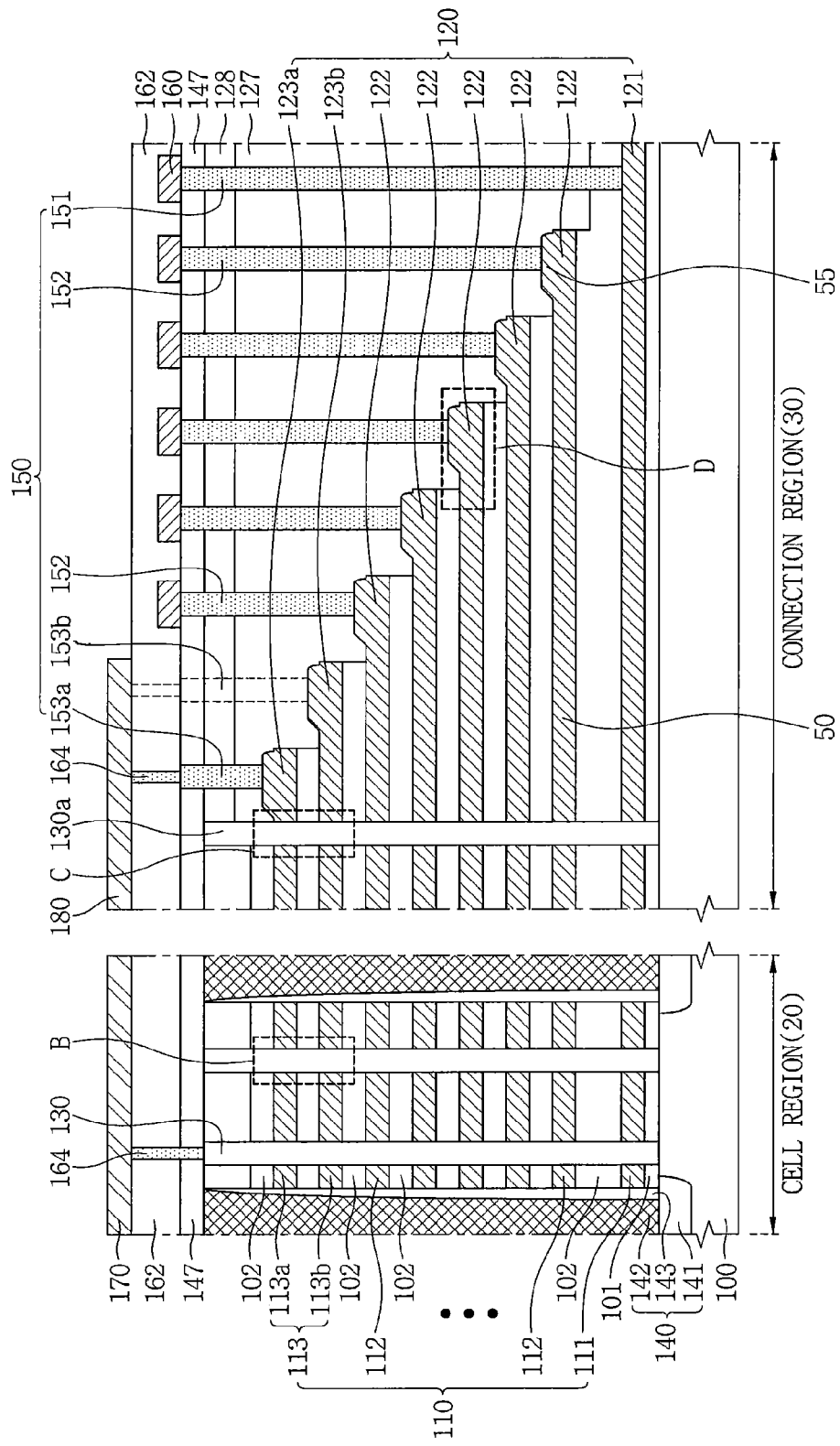
FIG. 3 is a cross-sectional view taken along lines I-I' and II-II' of FIG. 2.

FIG. 2 is an enlarged view of the area labeled A in FIG. 1. FIG. 3 is a cross-sectional view taken along lines I-I' and II-II' of FIG. 2.

Referring to FIGS. 2 and 3, the semiconductor device includes the cell region 20 and the connection region 30. The semiconductor device may include gate electrodes 110, interlayer insulating layers 102, vertical channel structures 130, and common source structures 140 in the cell region 20, and pads 120, contact plugs 150, dummy pillars 130a, and a capping insulating layer 127 in the connection region 30. The semiconductor device may further include a buffer insulating layer 101, a first upper interlayer insulating layer 128, a second upper interlayer insulating layer 147, a third upper interlayer insulating layer 162, first metal lines 160, second metal lines 180, interconnection plugs 164, and bit lines 170.

The gate electrodes 110 and the interlayer insulating layers 102 may surround sidewalls of the vertical channel structures 130 and extend from the cell region 20 in a direction toward the connection region 30. The gate electrodes 110 may be insulated from each other by the interlayer insulating layers 102. The gate electrodes 110 may include at least one ground selection gate electrode 111, a plurality of cell gate electrodes 112, and at least two string selection gate electrodes 113. The ground selection gate electrode 111 may be below the cell gate electrodes 112 and the string selection gate electrodes 113 may be above the cell gate electrodes 112.

The string selection gate electrodes 113 may include first string selection gate electrodes 113a and second string selection gate electrodes 113b. The first string selection gate electrodes 113a may be above the second string selection gate electrodes 113b. The cell gate electrodes 112 may have substantially the same thickness. The ground selection gate electrode 111 and the string selection gate electrodes 113 may have a different thickness from the cell gate electrodes 112. For example, the ground selection gate electrode 111 and the string selection gate electrodes 113 may be thicker than the cell gate electrodes 112. In some embodiment, the cell gate electrodes 112 may correspond to wordlines. When the ground selection gate electrode 111 corresponds to a ground selection line, the string selection gate electrodes 113 may correspond to string selection lines. The gate electrodes 110 may include a metal material, such as tungsten, copper, and a metal silicide.

The interlayer insulating layers 102 may have the same thickness or different thicknesses from each other. For example, the lowermost interlayer insulating layer 102 may be thicker than the other interlayer insulating layers 102. The interlayer insulating layers 102 may include an insulating material, such as silicon oxide, silicon nitride, and silicon oxynitride. In the cell region 20, the gate electrodes 110 and the interlayer insulating layers 102 may be alternately stacked in the vertical direction.

The vertical channel structures 130 may vertically penetrate the gate electrodes 110 and the interlayer insulating layers 102, respectively, to be in contact with a substrate 100. As shown in FIG. 2, the vertical channel structures 130 may be two-dimensionally arranged in a plan view. The vertical channel structures 130 may be arranged in a zigzag manner. The vertical channel structures 130 will be described in greater detail herein with reference to FIGS. 4A and 4B.

The common source structures 140 may also vertically penetrate the gate electrodes 110 and the interlayer insulating layers 102. Each of the common source structures 140 may include a common source area 141, a common source line 142, and a spacer 143. The common source area 141 may be formed in the substrate 100. The common source area 141 may include impurities, such as phosphorus (P) or arsenic (As), injected in the substrate 100. The common source line 142 may vertically penetrate the gate electrodes 110 and the interlayer insulating layers 102 to contact the common source area 141. The common source line 142 may include a conductive material, such as tungsten (W) or another metal. The common source line 142 may have a dam shape. For example, in a top view, the common source line 142 may have a line or bar shape. The spacer 143 may be formed between the common source line 142 and the gate electrodes 110 and interlayer insulating layers 102. The spacer 143 may be disposed on sidewalls of the common source line 142. The spacer 143 may insulate the common source line 142 from the gate electrodes 110. The spacer 143 may include silicon oxide, silicon nitride, silicon oxynitride, or another insulating material.

In the connection region 30, the pads 120 and the interlayer insulating layers 102 may be alternately stacked in a vertical direction. The pads 120 may include a ground selection pad 121, cell pads 122, and string selection pads 123a and 123b. The ground selection pad 121, the cell pads 122, and the string selection pads 123a and 123b may respectively extend from the ground selection gate electrode 111, the cell gate electrodes 112, and the string selection gate electrodes 113a and 113b in the cell region 20 to form a cascade structure in the connection region 30. The pads 120 may be conductive pads. For example, the pads 120 may include a metal material, such as tungsten, copper, and a metal silicide. The pads 120 will be described in greater detail herein with reference to FIGS. 5A to 5F.

The contact plugs 150 may vertically penetrate the capping insulating layer 127, the first upper interlayer insulating layer 128, and the second upper interlayer insulating layer 147 to electrically connect each of the pads 121, 122, and 123a and 123b to one of the first metal lines 160 or the second metal lines 180. The contact plugs 150 may include a ground selection plug 151, cell plugs 152, and string selection plugs 153a and 153b. The cell plugs 152 and the string selection plugs 153a and 153b may be in contact with the cell pads 122 and the string selection pads 123a and 123b, respectively. The ground selection plug 151 may penetrate the capping insulating layer 127, the first and second upper interlayer insulating layers 128 and 147, and the lowermost interlayer insulating layer 102 to contact the ground selection pad 121. Referring to FIG. 2, the cell and ground selection plugs 152 and 151 may be disposed in generally straight lines crossing centers of contact areas of the cell and ground selection pads 122 and 121. The string selection plugs 153a and 153b may be spaced apart from the centers of the contact areas of the string selection pads 123a and 123b so that the string selection plugs 153a and 153b are not collinear with the cell and ground selection plugs 152 and 151 that are arranged in the generally straight lines.

The dummy pillars 130a may penetrate the pads 120 and the interlayer insulating layers 102 to contact the substrate 100. As shown in FIG. 2, the dummy pillars 130a may pass through boundaries of adjacent pads 120 (a "boundary" refers to a location where a pad ends to expose an underlying pad in a top view). As shown in FIG. 2, two dummy pillars 130a are provided at the boundaries between adjacent to the pads 120 in a top view. The dummy pillars 130a may have the same structure as the vertical channel structures 130.

The buffer insulating layer 101 may be interposed between the ground selection gate electrode 111 and the substrate 100 in the cell region 20, and between the ground selection pad 121 and the substrate 100 in the connection region 30. The buffer insulating layer 101 may include an insulating material, such as silicon oxide, silicon nitride, and silicon oxynitride.

The capping insulating layer 127 may be formed on upper and side surfaces of the pads 120 in the connection region 30.

The first upper interlayer insulating layer 128 may surround upper portions of the side surfaces of the vertical channel structures 130 and the common source structures 140 in the cell region 20, and may surround portions of the side surfaces of the dummy pillars 130a and the contact plugs 150 in the connection region 30 that are above the capping insulating layer 127 and below the second upper interlayer insulating layer 147. For example, the vertical channel structures 130 and the common source structures 140 may vertically penetrate the first upper interlayer insulating layer 128. A lower surface of the first upper interlayer insulating layer 128 that is formed in the cell region 20 may be located at a lower level than a lower surface of the first upper interlayer insulating layer 128 that is formed in the connection region 30, as shown in FIG. 3.

The second upper interlayer insulating layer 147 may be formed on the first upper interlayer insulating layer 128 to cover the vertical channel structures 130 and the common source structures 140 in the cell region 20. The second upper interlayer insulating layer 147 may cover the dummy pillars 130a in the connection region 30.

The third upper interlayer insulating layer 162 may be formed on the second upper interlayer insulating layer 147. The third upper interlayer insulating layer 162 may surround side surfaces of the interconnection plugs 164 and cover the first metal lines 160 in the connection region 30. The capping insulating layer 127 and the first to third upper interlayer insulating layers 128, 147, and 162 may include at least one of high density plasma (HDP) oxide, tetra-ethyl-ortho-silicate (TEOS), plasma enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin-on-glass (SOG), tonen silazene (TOSZ), or a combination thereof.

The bit lines 170 may be formed on the third upper interlayer insulating layer 162. The bit lines 170 may include a metal such as tungsten (W).

In the cell region 20, the interconnection plugs 164 may be formed between the bit lines 170 and the vertical channel structures 130. The interconnection plugs 164 may electrically connect the bit lines 170 to the vertical channel structures 130. The interconnection plugs 164 may include a conductive material, such as doped silicon, a metal silicide, or a metal. In the connection region 30, the interconnection plugs 164 may be formed between the second metal lines 180 and the first and second string selection plugs 153a and 153b to electrically connect the second metal lines 180 to the first and second string selection plugs 153a and 153b.

Referring again to FIGS. 2 and 3, the first metal lines 160 may be disposed on the second upper interlayer insulating layer 147 in the connection region 30 to be aligned with the ground selection plug 151 and the cell plugs 152. The cell plugs 152 and the ground selection plug 151 may be electrically connected to the first metal lines 160.

The second metal lines 180 may be disposed on the third upper interlayer insulating layer 162. As noted above, the second metal lines 180 may be electrically connected to the first and second string selection plugs 153a and 153b via the interconnection plugs 164.

The semiconductor device in accordance with this embodiment of the inventive concepts may include the pads 120 having the cascade structure, and contact plugs 150 having different vertical lengths that electrically connect to the pads 120 in the connection region 30. The pads 120 may include an extension area 50 extending from the gate electrodes 110, and a contact area 55 that may be physically and electrically connected to the respective contact plugs 150. Since the contact area 55 has a vertically thicker structure than the extension area 50, a process margin for forming contact plugs 150 having different vertical heights can be sufficiently secured.

Figure 4A:
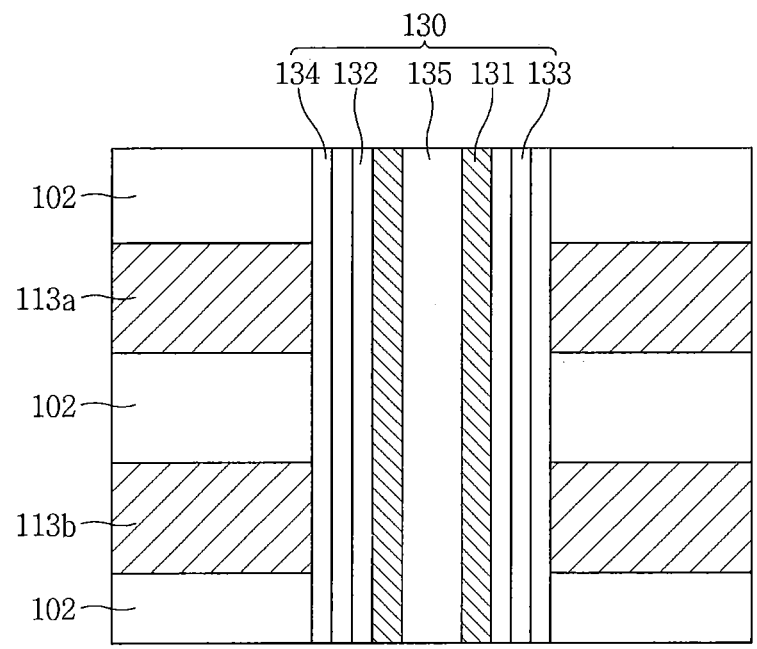
FIGS. 4A and 4B are enlarged views of areas labeled B and C in FIG. 3, respectively.
Figure 4B:
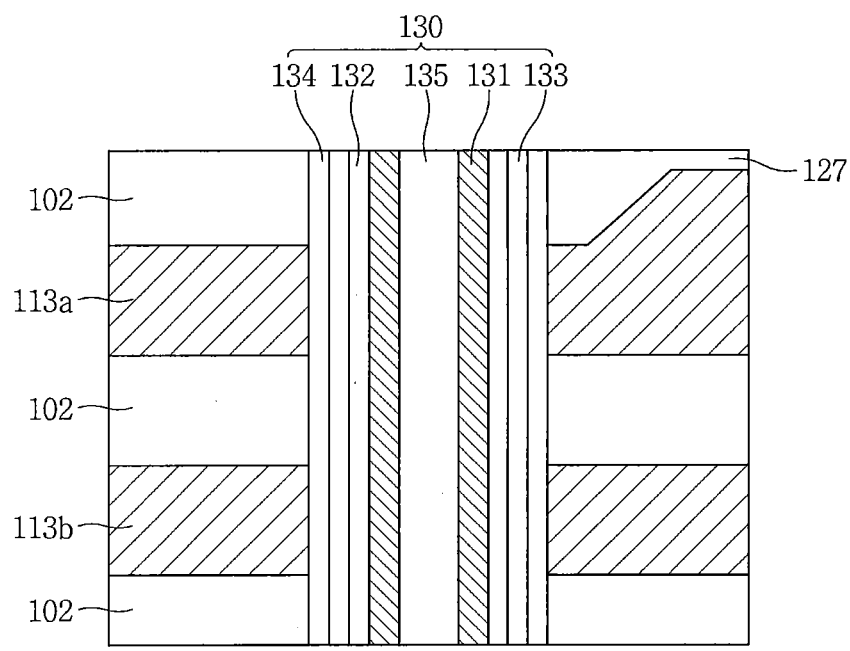

FIGS. 4A and 4B are enlarged views showing parts B and C of FIG. 3. FIGS. 4A and 4B illustrate details of the vertical channel structures 130 and the dummy pillars 130a of FIG. 3 that are not visible in FIG. 3 due to the scale of the drawing.

Referring to FIG. 4A, the vertical channel structure 130 may include a vertical channel 131, a tunnel insulating layer 132, a charge storage layer 133, a blocking layer 134, and a filling layer 135 which extend upward vertically from the substrate 100. The vertical channel structure 130 may have a cylindrical shape. The vertical channel 131, the tunnel insulating layer 132, the charge storage layer 133, and the blocking layer 134 may each have an annular shape in a horizontal cross-section taken through the vertical channel structure 130 that is parallel to a top surface of the substrate 100. The filling layer 135 may have a cylindrical shape and may fill the open space that is surrounded by the vertical channel 131.

The tunnel insulating layer 132, the charge storage layer 133, and the blocking layer 134 may be interposed between the gate electrodes 111-113 and the vertical channel 131. The blocking layer 134 may be adjacent to the gate electrodes 111-113, and the tunnel insulating layer 132 may be adjacent to the vertical channel 131. The charge storage layer 133 may be interposed between the blocking layer 134 and the tunnel insulating layer 132. The tunnel insulating layer 132 may include, for example, at least one of silicon oxide, silicon nitride, and silicon oxynitride. The charge storage layer 133 may include, for example, a silicon nitride layer including trap sites or an insulating layer including conductive nano dots. The blocking layer 134 may include, for example, a high dielectric layer having a higher dielectric constant than the tunnel insulating layer 132.

The blocking layer 134, the charge storage layer 133, and the tunnel insulating layer 132 may extend vertically to cover a sidewall of the vertical channel 131. The filling layer 135 may include, for example, silicon oxide. Referring to FIG. 4B, the dummy pillar 130a may have the same structure as the vertical channel structure 130. According to the present embodiment of the inventive concepts, the dummy pillar 130a may include, like the vertical channel structure 130, the blocking layer 134, the charge storage layer 133, the tunnel insulating layer 132, the vertical channel 131, and the filling layer 135.

FIGS. 5A to 5F are enlarged views showing an area labeled D in FIG. 3 that illustrate various exemplary embodiments of the end portions of the pads 120 of FIG. 3.

Figure 5A:
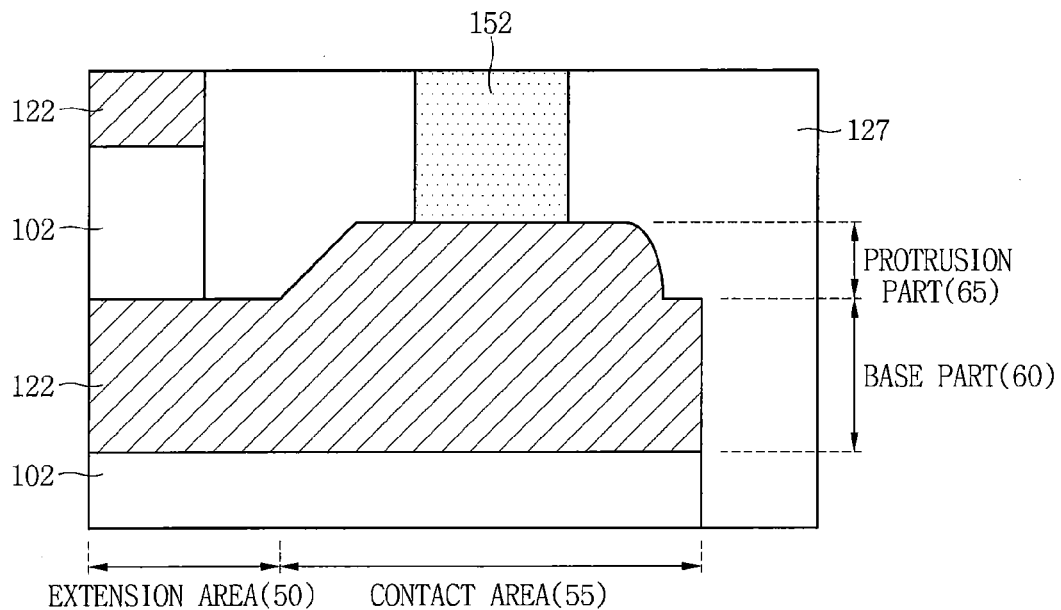
FIGS. 5A to 5F are enlarged views of an area labeled D in FIG. 3.

Referring to FIG. 5A, the pad 120 in accordance with an embodiment of the inventive concept may include an extension area 50 and a contact area 55.

As shown in FIG. 3, the extension area 50 may be a part of the pad 120 that extends horizontally from one of the gate electrodes 110. The extension area 50 may be co-planar with the gate electrodes 110.

The contact area 55 may include a base part 60 and a protrusion part 65. The base part 60 may have the same shape and thickness as the extension area 50 and may simply comprise a further horizontal extension of the extension area 50. Accordingly, an upper surface of the base part 60 may be substantially co-planar with an upper surface of the extension area 50. An outer side surface of an end portion of the base part 60 may be vertically aligned with an outer side surface of an end portion of the interlayer insulating layer 102 located thereunder. The protrusion part 65 may protrude upwardly from the base part 60. Accordingly, the contact area 55 may be thicker than the extension area 50 (i.e., extend further in the vertical direction). A lower surface of the contact area 55 may be co-planar with a lower surface of the extension area 50. Side surfaces of the protrusion part 65 may be inclined. An inner side surface of the protrusion part 65 may have a flat surface and may connect an upper surface of the protrusion part to the extension area 50. An outer side surface of the protrusion part 65 may be opposite the inner side surface and may be rounded. The upper surface of the protrusion part 65 may be flat. The ending portion of the base part 60 may extend horizontally farther than the protrusion part 65.

Figure 5B:
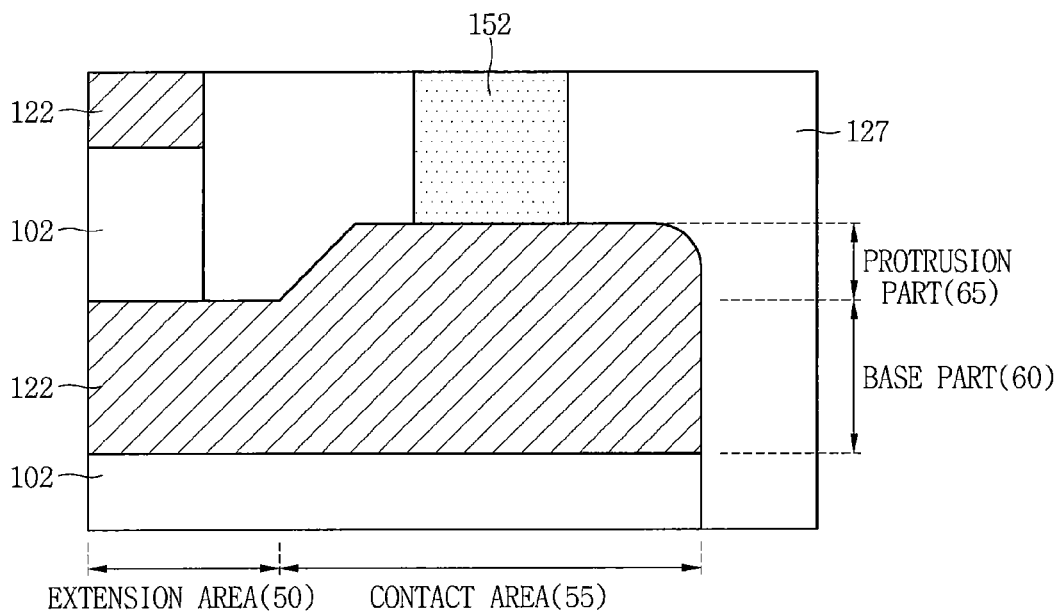

Referring to FIG. 5B, a contact area 55 of a pad 120 in accordance with another embodiment of the inventive concepts may include a base part 60 and a protrusion part 65, and an outer side surface of the protrusion part 65 may be substantially vertically aligned with an outer side surface of the base part 60. An upper portion of an outer side surface of the protrusion part 65 may be rounded.

Figure 5C:
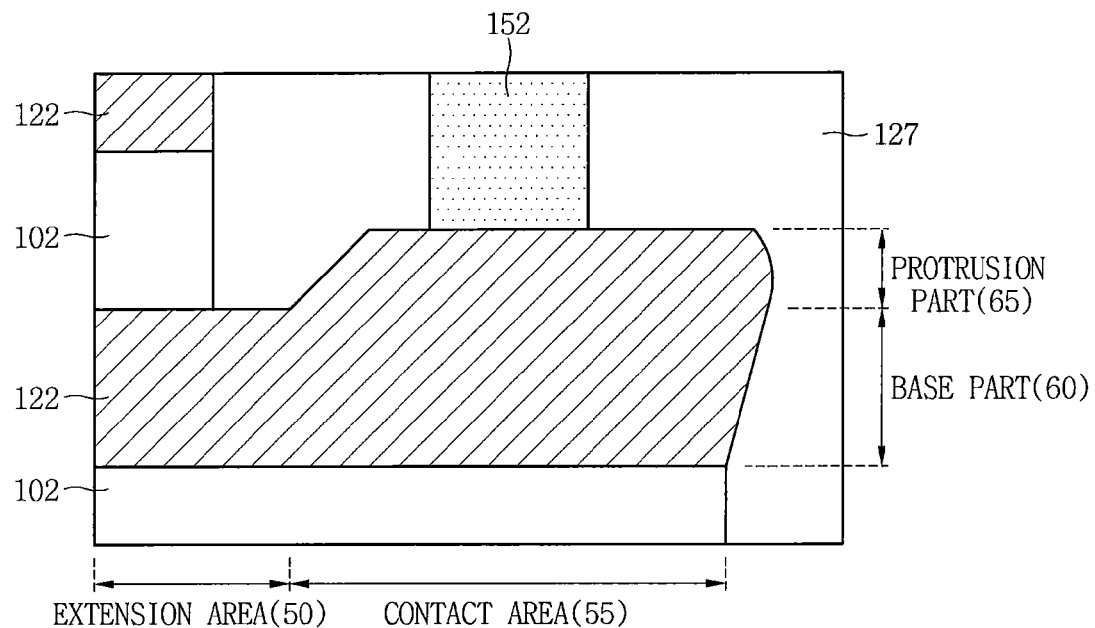

Referring to FIG. 5C, in still another embodiment, an outer side surface of the base part 60 and/or an outer side surface of the protrusion part 65 in the pad 120 may be reverse tapered. The outer side surface of the protrusion part 65 and the outer side surface of the base part 60 may be smoothly continuous. An upper portion of an outer side surface of the protrusion part 65 may be rounded.

Figure 5D:
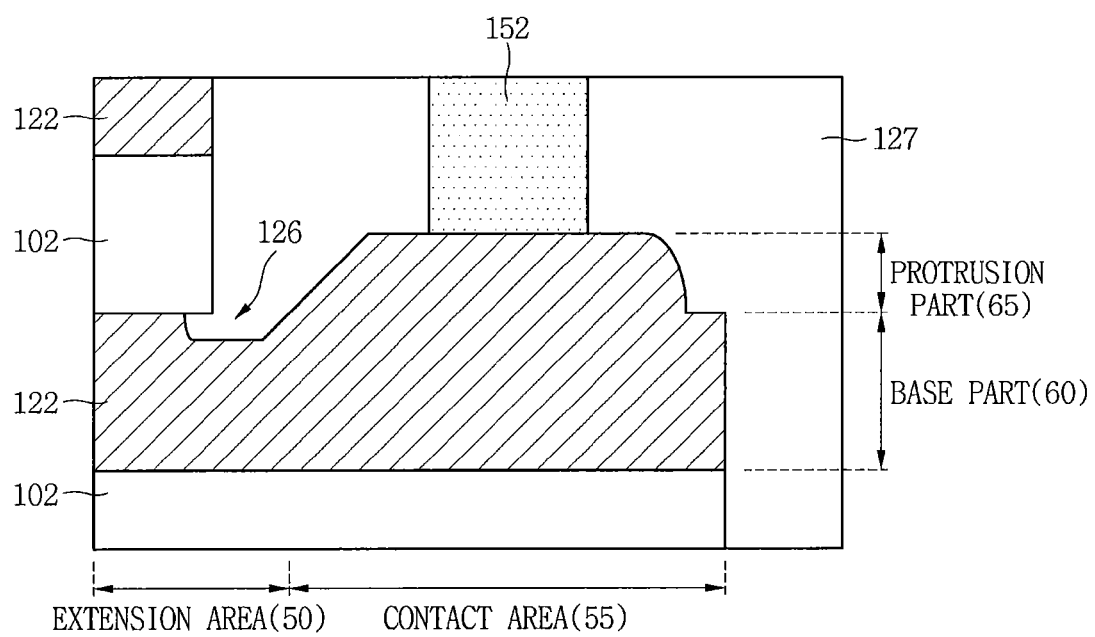
Figure 5E:
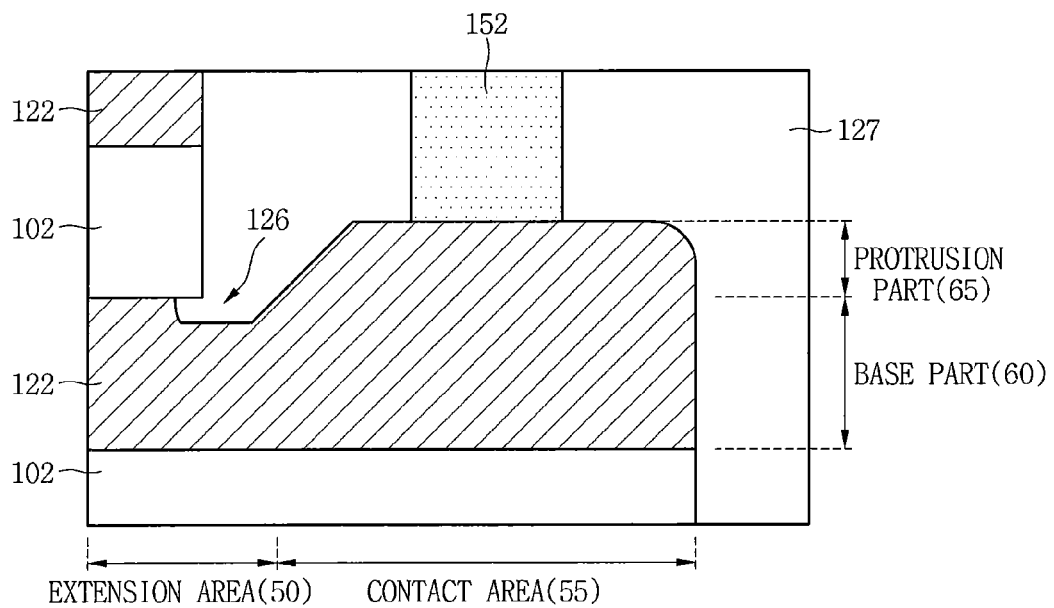
Figure 5F:
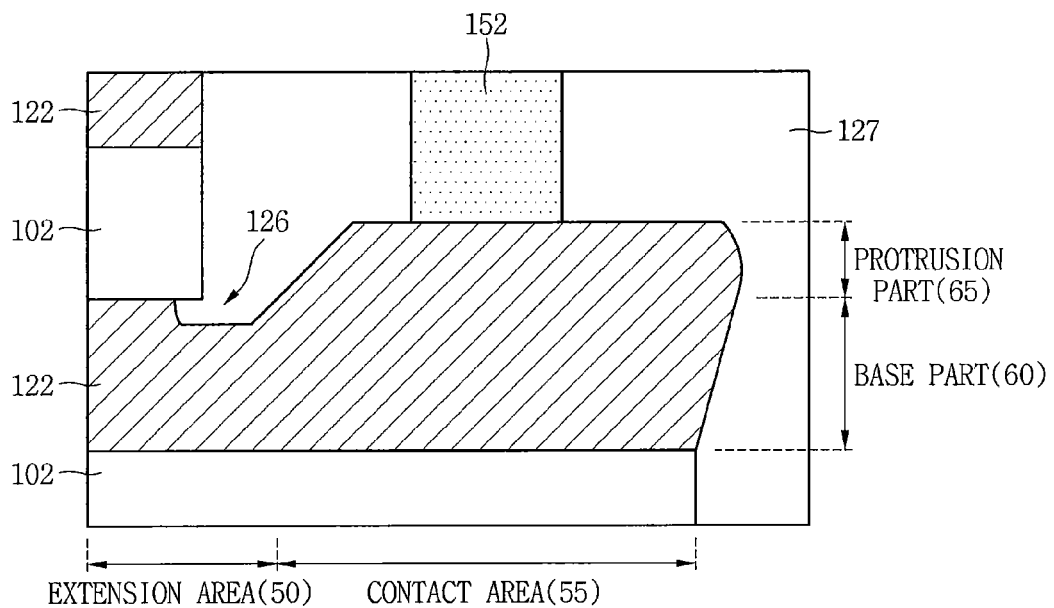

Referring to FIGS. 5D to 5F, in still further embodiments the pads 120 of FIGS. 5A to 5C may further include a recess 126 in the top portion of the extension area 50 that is adjacent the contact area 55.

Figure 6A:
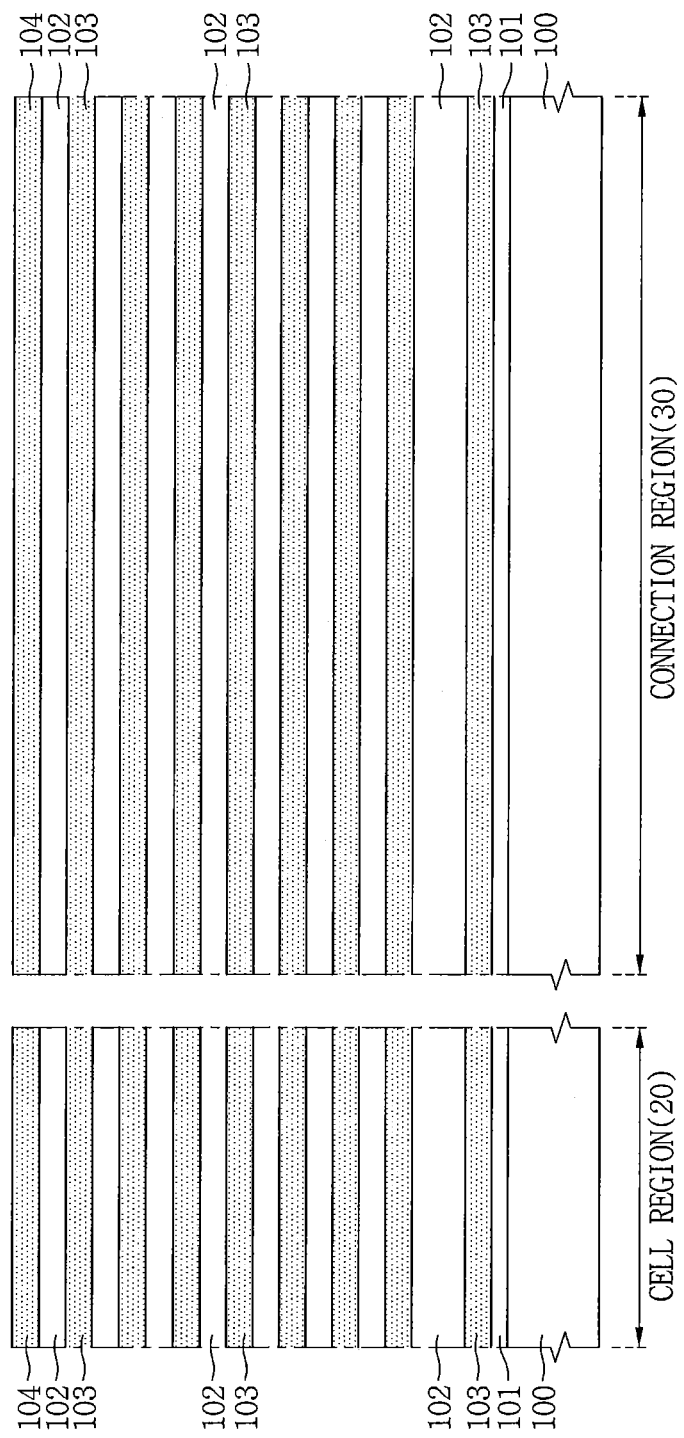
FIGS. 6A to 6P are cross-sectional views taken along lines I-I' and II-II' of FIG. 2 that illustrate a method of forming a semiconductor device in accordance with an embodiment of the inventive concepts.
Figure 6F:
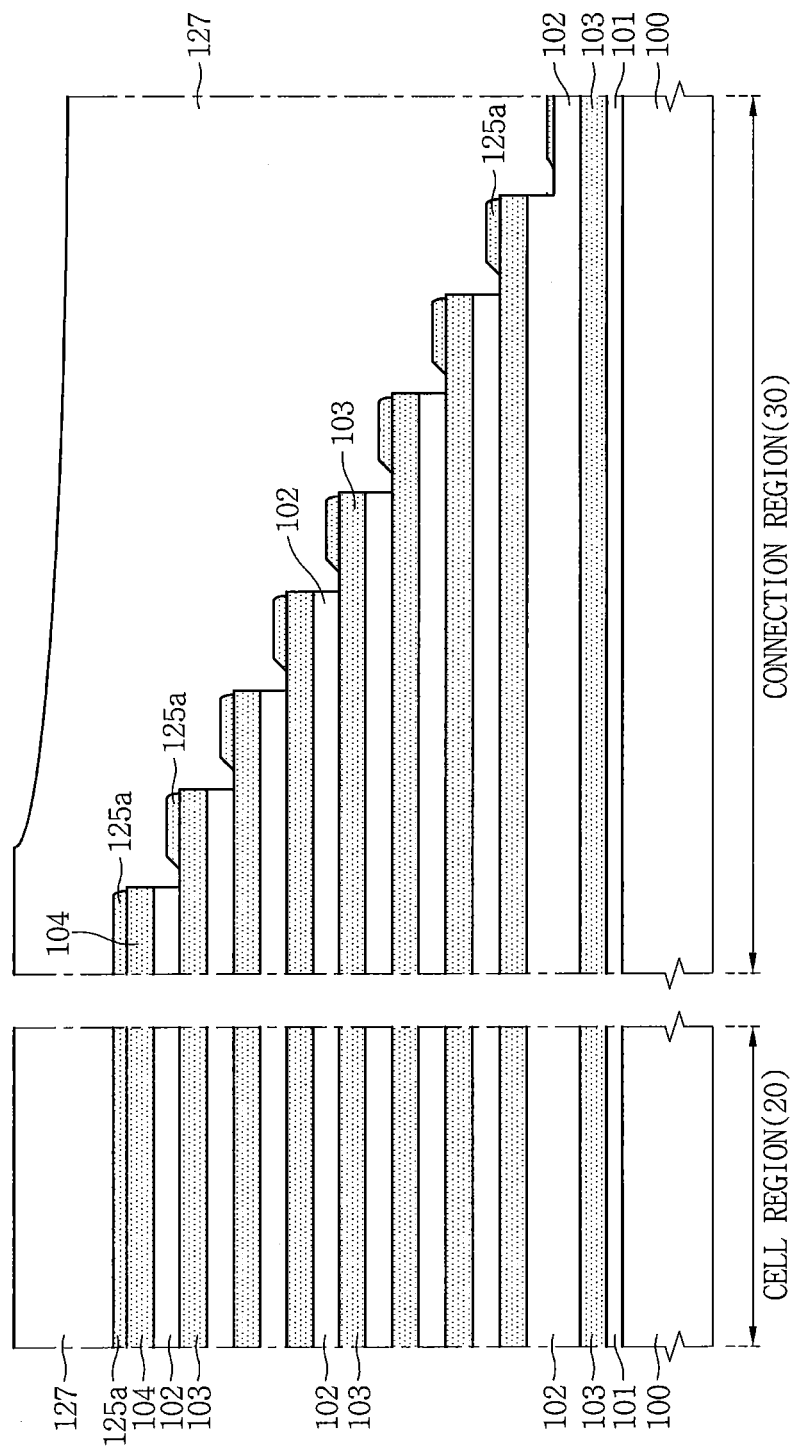
Figure 6H:
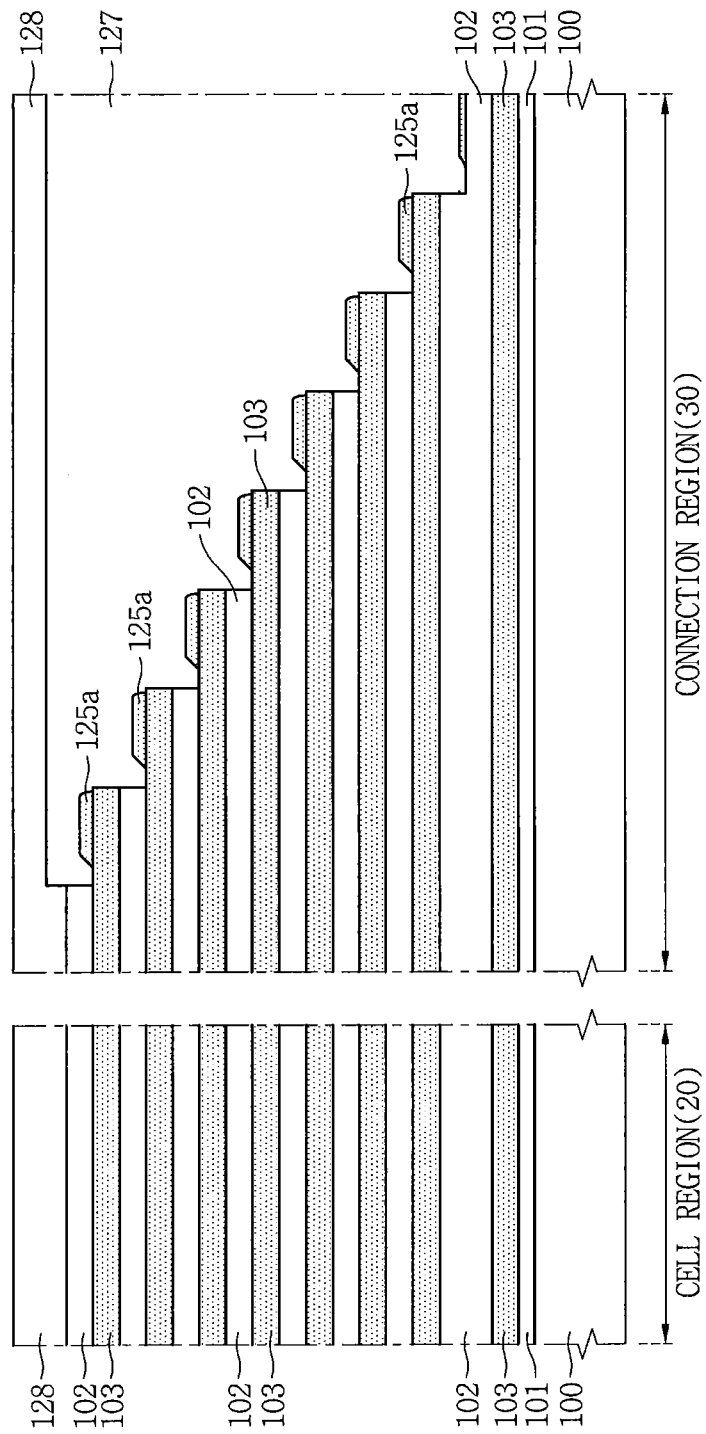
Figure 6K:
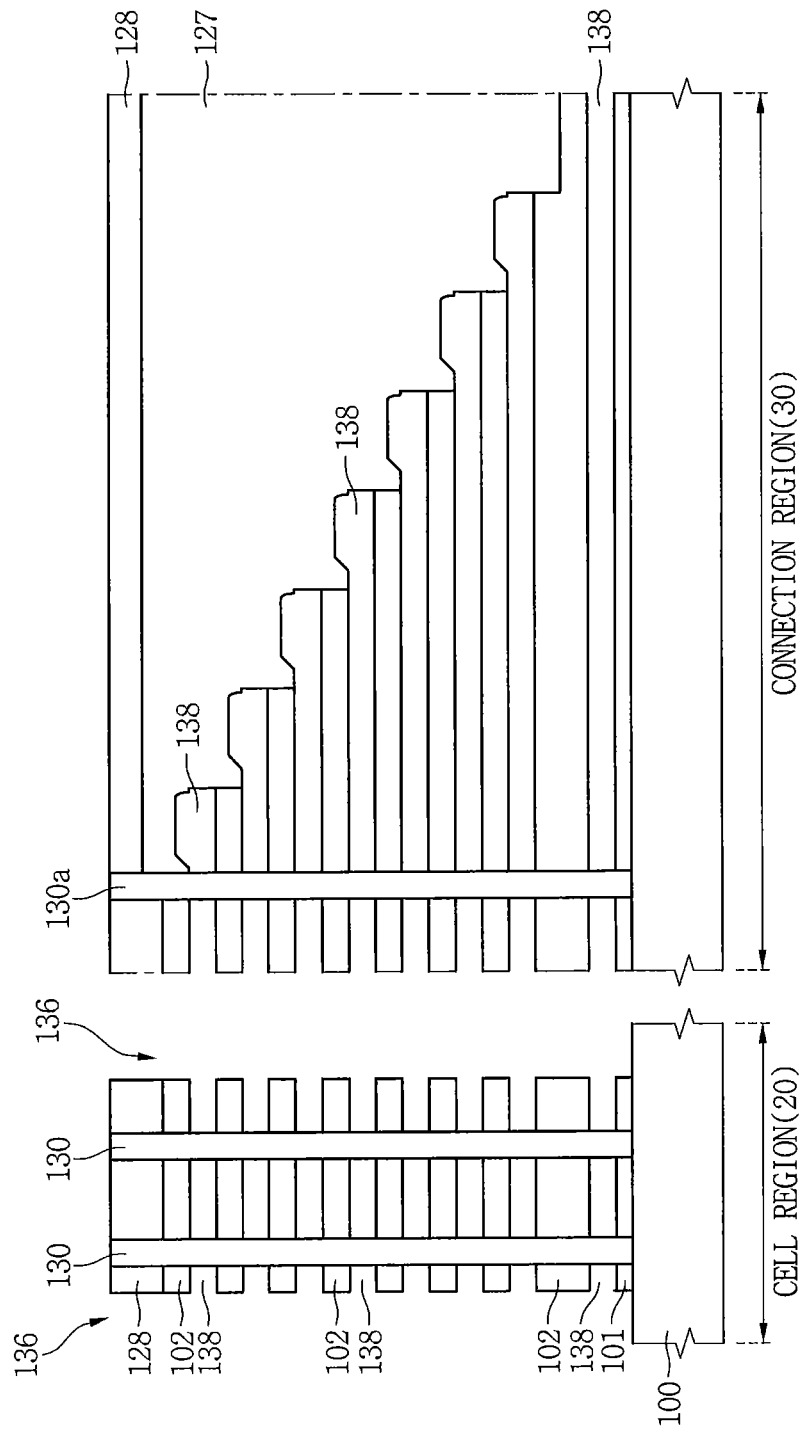
Figure 6L:
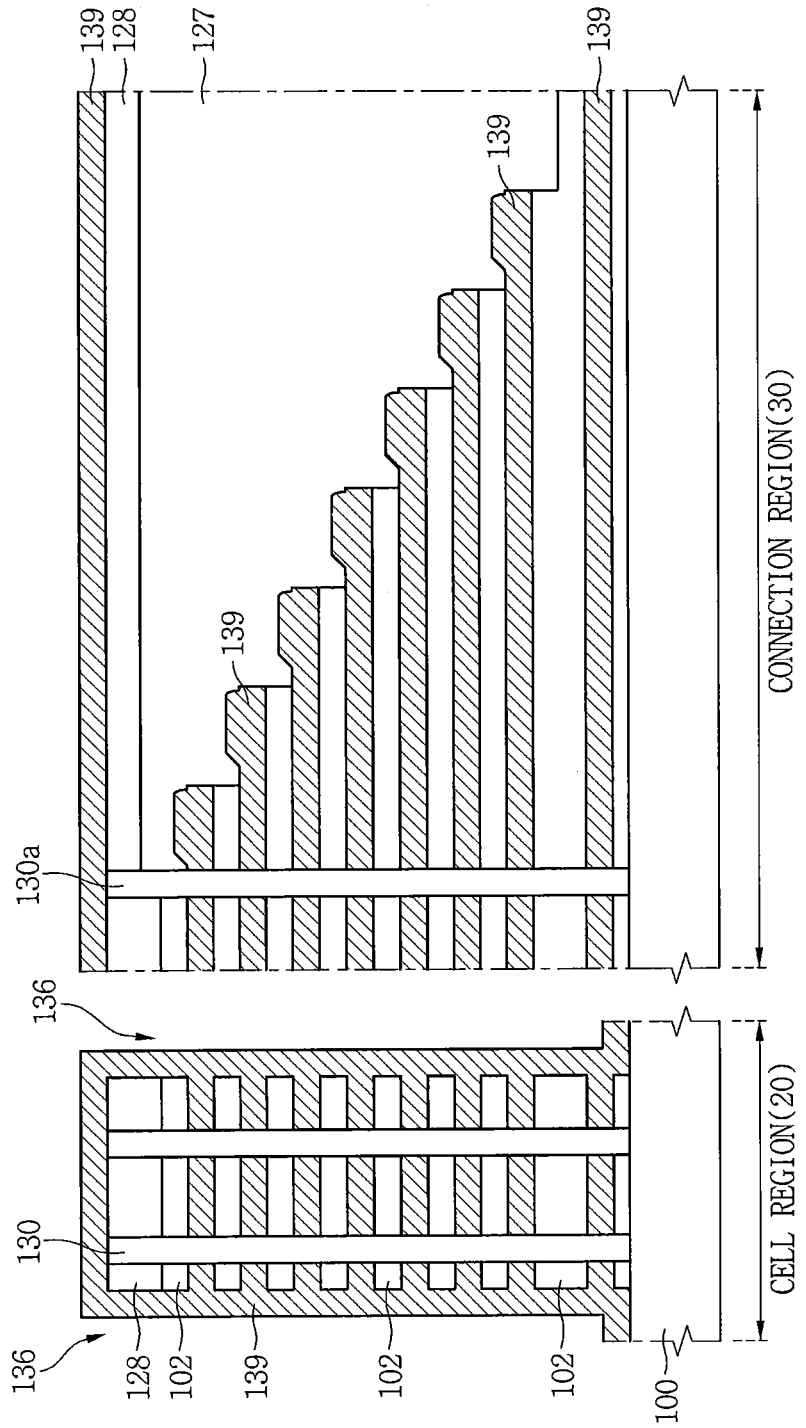
Figure 6N:
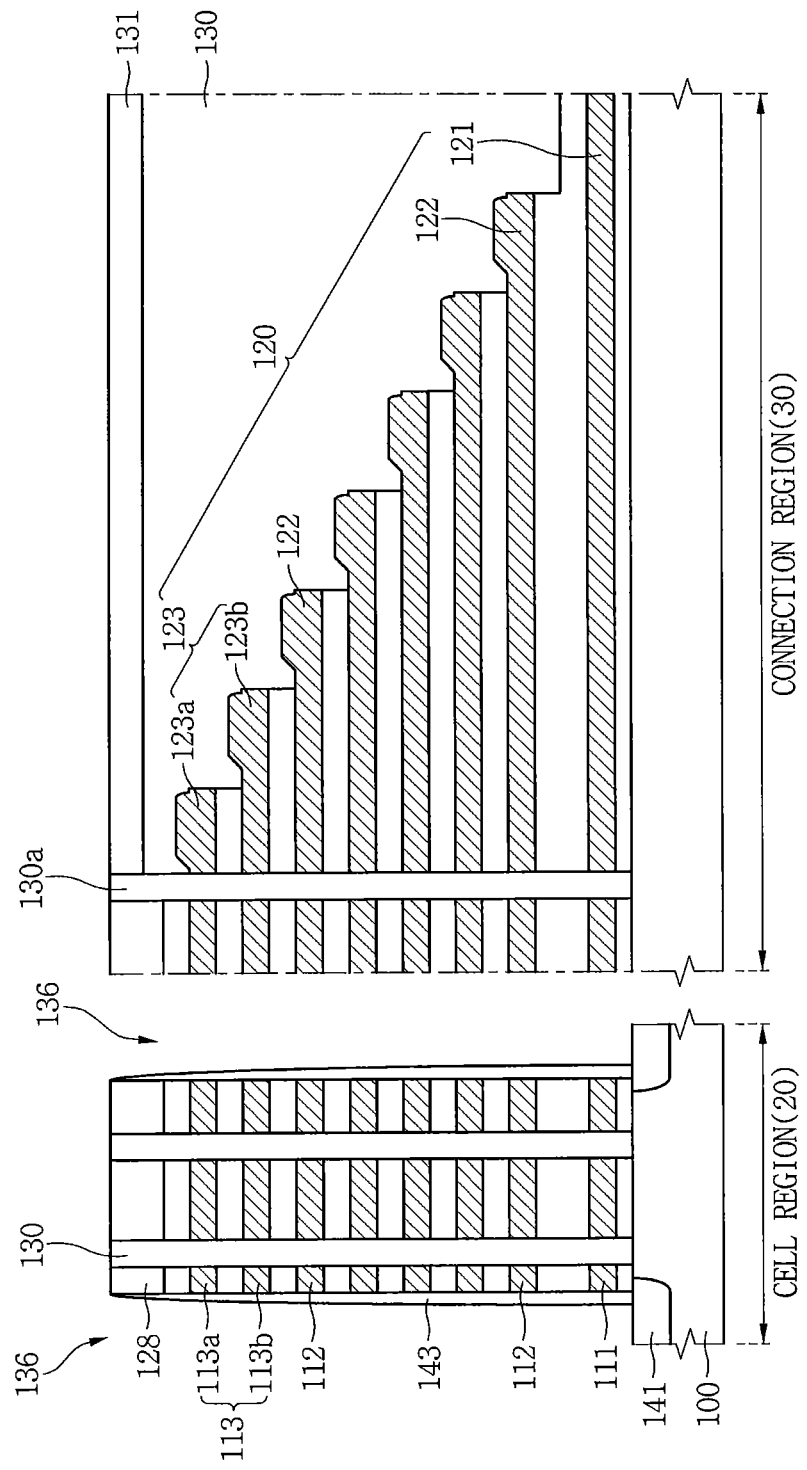
Figure 60:
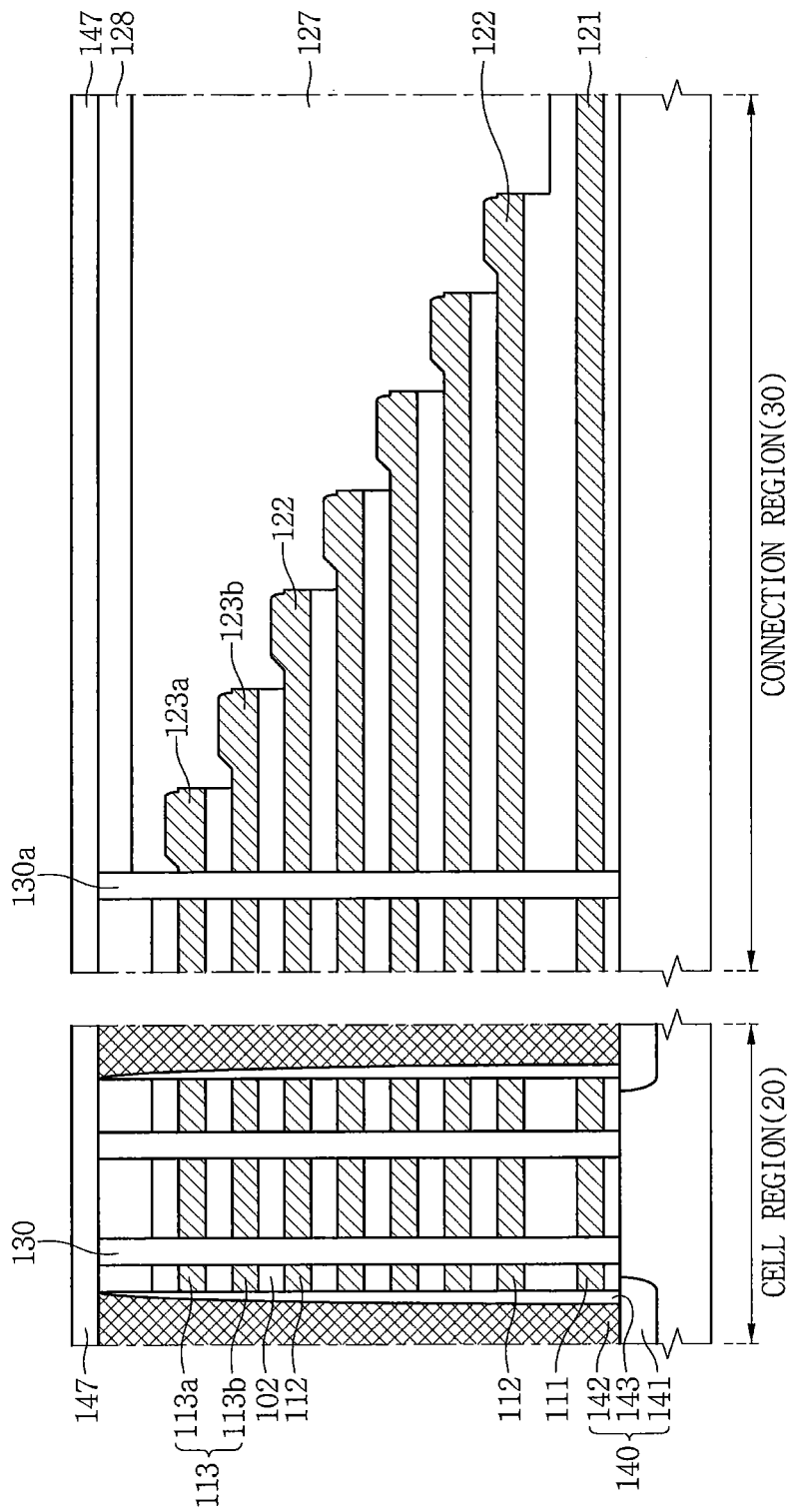
Figure 6P:
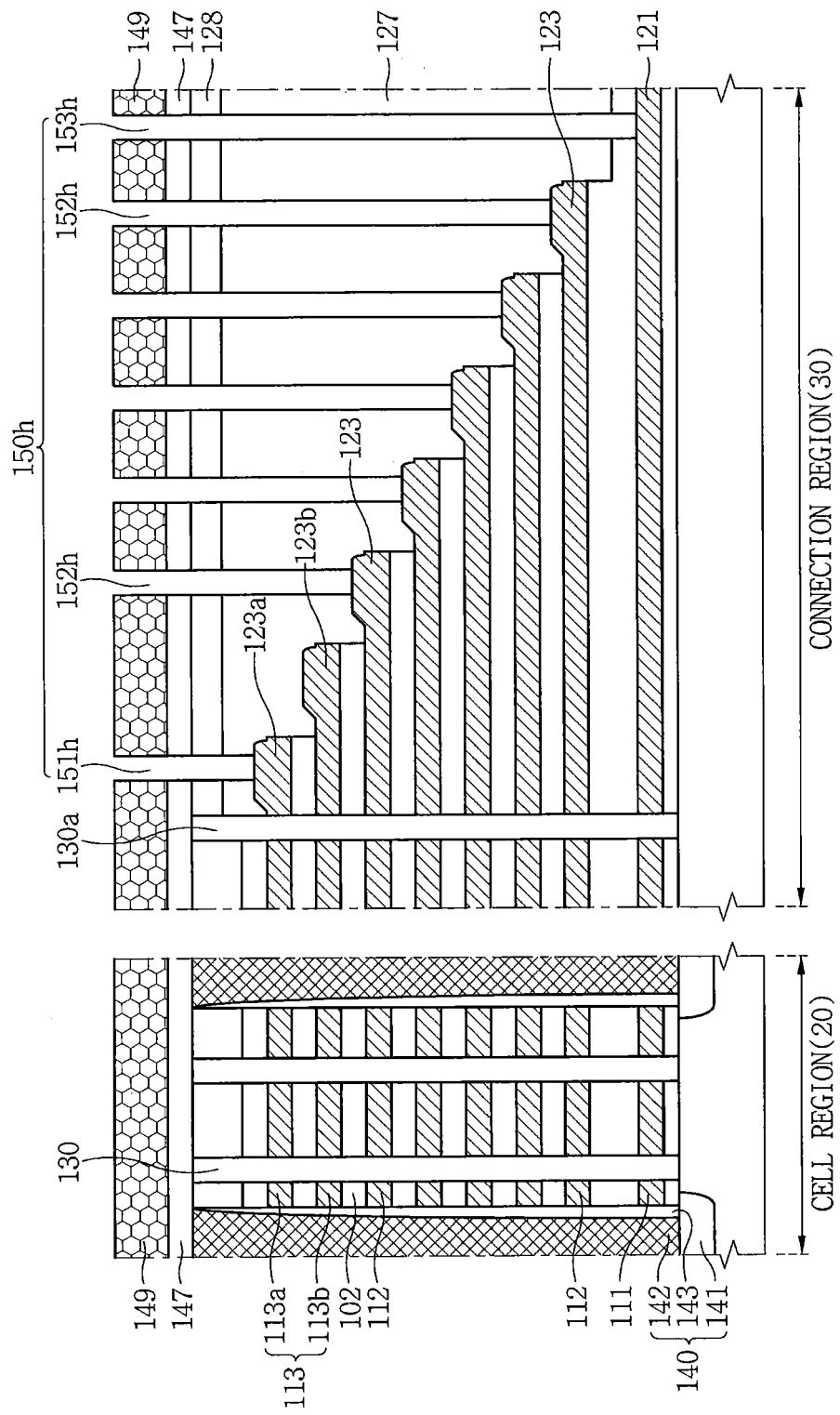

FIGS. 6A to 6P are cross-sectional views taken along lines I-I' and II-II' of FIG. 2 that illustrate a method of forming a semiconductor device in accordance with an embodiment of the inventive concepts.

Referring to FIG. 6A, a buffer insulating layer 101 may be formed on a substrate 100 having a cell region 20 and a connection region 30, and sacrificial layers 103 and interlayer insulating layers 102 may be alternately and repeatedly forming on the buffer insulating layer 101. A polishing stop layer 104 may be formed on the uppermost interlayer insulating layer 102. The resulting structure may have a plurality of interlayer insulating layers 102 and a plurality of sacrificial layers 103 that are alternately stacked on the buffer insulating layer 101 in a direction perpendicular to the substrate 100.

The substrate 100 may comprise, for example, a silicon wafer, an epitaxially grown SiGe wafer, or an SOI wafer.

The buffer insulating layer 101 and the interlayer insulating layers 102 may include an insulating material such as silicon oxide. The buffer insulating layer 101 may be thinner than the interlayer insulating layers 102. Thicknesses of the interlayer insulating layers 102 may be different from each other. For example, the lowermost interlayer insulating layer 102 may be thicker than the other interlayer insulating layers 102.

The sacrificial layers 103 and the polishing stop layer 104 may include a material that has an etch selectivity with respect to both the buffer insulating layer 101 and the interlayer insulating layers 102. For example, the sacrificial layers 103 and the polishing stop layer 104 may include an insulating material such as silicon nitride.

Referring to FIG. 6B, the interlayer insulating layers 102, the sacrificial layers 103, and the polishing stop layer 104 in the connection region 30 may be patterned to form a cascade structure (i.e., a structure having a stepped profile). The cascade structure may be implemented by patterning and etching the interlayer insulating layers 102, the sacrificial layers 103, and the polishing stop layer 104 several times.

Referring to FIG. 6C, the exposed portions of the interlayer insulating layers 102 (in a top view) in the cascade structure may be removed to expose end portions of the sacrificial layers 103. The exposed portions of the interlayer insulating layers 102 in the cascade structure may be removed using the patterned polishing stop layer 104 as an etch mask, and the sacrificial layers 103 as an etch stop layer. The lowermost interlayer insulating layer 102 disposed on the cascade structure may be partially etched (since the lowermost interlayer insulating layer 102 may be thicker than the other interlayer insulating layers 102), and thus the lowermost sacrificial layer 103 may be not exposed.

Referring to FIG. 6D, a sacrificial insulating layer 125 may be formed on the polishing stop layer 104 and on the sacrificial layers 103 having the cascade structure. The sacrificial insulating layer 125 may be deposited to have a step-coverage of 50% or less. The step-coverage may be defined as a ratio of the thickness of the sacrificial insulating layer 125 that is deposited on an upper surface of the cascade structure (at the points where the thickness is greatest) to the thickness of the sacrificial insulating layer 125 that is deposited on a side surface of the cascade structure. For example, when the thickness of the sacrificial insulating layer 125 deposited on the upper surface of the cascade structure is t1, and the thickness of the sacrificial insulating layer 125 deposited on the side surface of the cascade structure is t2, the step-coverage may refer to a ratio of t1 to t2. According to the present embodiment of the inventive concepts, t2 may be half of t1, or less. In addition, the sacrificial insulating layer 125 may be deposited to have the smallest thickness in corners where the side surfaces and the upper surfaces of the cascade structure meet. The sacrificial insulating layer 125 may include the same material as the sacrificial layer 103. The sacrificial insulating layer 125 may include a material having an etch selectivity with respect to the interlayer insulating layers 102. For example, the sacrificial insulating layer 125 may include an insulating material such as silicon nitride.

Referring to FIG. 6E, the sacrificial insulating layer 125 may be partially etched to form sacrificial insulating patterns 125a. In particular, the sacrificial insulating layer 125 may be separated into the plurality of sacrificial insulating patterns 125a by performing a partial etch process. For example, the sacrificial insulating layer 125 formed on side surfaces of the interlayer insulating layers 102 and formed in the corners where the side surfaces and the upper surfaces of the cascade structure meet may be fully removed by the etching process. The sacrificial insulating patterns 125a may be formed on the polishing stop layer 104 in the cell region 20, and on the polishing stop layer 104 and on upper surfaces of the sacrificial layers 103 having the cascade structure in the connection region 30. The sacrificial insulating patterns 125a may not fully cover the upper surfaces of the sacrificial layers 103 and may comprise a discontinuous pattern in the connection region 30. Accordingly, parts of the upper surfaces of the sacrificial layers 103 may be exposed. The etch process may include an isotropic etch process. The isotropic etch process may include a wet etch process or a dry etch process. The wet etch process may use, for example, an etchant including phosphoric acid.

Referring to FIG. 6F, a capping insulating layer 127 may be formed on the entire surface of the device. In some embodiments, the capping insulating layer 127 may be deposited to have a sufficient thickness to cover the sacrificial insulating patterns 125a. The capping insulating layer 127 may include a material having an etch selectivity with respect to the polishing stop layer 104. The capping insulating layer 127 may include, for example, HDP oxide, TEOS, PE-TEOS, O₃-TEOS, USG, PSG, BSG, BPSG, FSG, SOG, TOSZ, or a combination thereof.

Referring to FIG. 6G, the capping insulating layer 127 may be planarized via a planarization process such as, for example, a chemical mechanical polishing (CMP) process. The polishing stop layer 104 may be used as a planarization stop point. Accordingly, an upper surface of the polishing stop layer 104 may be partially or fully exposed. The sacrificial insulating patterns 125a located on the polishing stop layer 104 may be partially or fully etched by the planarization process. In some embodiments, the sacrificial insulating patterns 125a located on the polishing stop layer 104 may be used as the planarization stop point. In this case, the sacrificial insulating patterns 125a may be over-polished to be fully removed in the planarization process.

Referring to FIG. 6H, the polishing stop layer 104 may be removed using, for example, a wet etch process to expose the uppermost interlayer insulating layer 102 and a first upper interlayer insulating layer 128 may be formed on the capping insulating layer 127 and the uppermost interlayer insulating layer 102. An etchant including phosphoric acid may be used in the wet etch process. Accordingly, the capping insulating layer 127 may be fully removed in the cell region 20, and remain only in the connection region 30. The first upper interlayer insulating layer 128 may include the same material as the capping insulating layer 127. In some embodiments, an upper surface of the first upper interlayer insulating layer 128 may be planarized using an etchback process or a CMP process.

Referring to FIG. 6I, vertical channel structures 130 may be formed in the cell region 20, and dummy pillars 130a may be formed in the connection region 30. For example, channel holes 129 may be formed in the cell region 20 that vertically penetrate the first upper interlayer insulating layer 128, the interlayer insulating layers 102, the sacrificial layers 103, and the buffer insulating layer 101, and the vertical channel structures 130 may then be formed in the channel holes 129. Likewise, dummy holes 129a may be formed in the connection region 30 that vertically penetrate the first upper interlayer insulating layer 128, the capping insulating layer 127, the interlayer insulating layers 102, the sacrificial layers 103, and the buffer insulating layer 101, and the dummy pillars 130a may then be formed in the dummy holes 129a. The channel holes 129 and the dummy holes 129a may be formed at the same time. The vertical channel structures 130 and the dummy pillars 130a may be formed at the same time. The vertical channel structures 130 and the dummy pillars 130a may comprise the structures shown in FIGS. 4A and 4B.

Referring to FIG. 6J, trenches 136 may be formed by consecutively patterning the interlayer insulating layers 102, the sacrificial layers 103, the buffer insulating layer 101, the first upper interlayer insulating layer 128, and the capping insulating layer 127. The trenches 136 may extend from the cell region 20 into connection region 30. The trenches 136 may be spaced apart from the vertical channel structures 130 and expose side surfaces of the interlayer insulating layers 102, the sacrificial layers 103, the buffer insulating layer 101, and the first upper interlayer insulating layer 128. In a plan view, the trenches 136 may have a line, bar, or rectangular shape, and in a side view, the trenches 136 may expose an upper surface of the substrate 100. In some embodiments, the upper surface of the substrate 100 that is exposed to the trenches 136 may be recessed by an over etch process (i.e., the trenches may extend below the upper surface of the substrate 100). In addition, the trenches 136 may have different widths depending on distances from the substrate 100 due to an anisotropic etch process.

Referring to FIG. 6K, the method may include forming gap areas 138 by removing the sacrificial layers 103 and the sacrificial insulating patterns 125a by performing an etch process. The etch process may include isotropically etching the sacrificial layers 103 and the sacrificial insulating patterns 125a through the trenches 136 by using an etchant having an etch selectivity with respect to the interlayer insulating layers 102, the first upper interlayer insulating layer 128, and the capping insulating layer 127. For example, when the sacrificial layers 103 and the sacrificial insulating patterns 125a are silicon nitride, and the interlayer insulating layers 102, the first upper interlayer insulating layer 128, and the capping insulating layer 127 are silicon oxide, the etch process may be executed using an etchant including phosphoric acid. The gap areas 138 may horizontally extend from the trenches 136 between the interlayer insulating layers 102 to expose parts of sidewalls of the vertical channel structures 130 and the dummy pillars 130a. End portions of the gap areas 138 in the connection region 30 may be expanded vertically since the sacrificial insulating patterns 125a are removed along with the sacrificial layers 103. Thus, the vertical height of the gap areas 138 in the cascade structure may be the sum of the vertical thickness of the sacrificial layers 103 and the vertical thickness of the sacrificial insulating patterns 125a that are on each sacrificial layer 103.

Referring to FIG. 6L, a conductive layer 139 may be formed to fill the gap areas 138. The conductive layer 139 may be formed using a deposition process providing excellent step coverage (e.g. a chemical vapor deposition (CVD) or an atomic layer deposition (ALD)). Accordingly, the conductive layer 139 may be conformally formed in the trenches 136 and on the upper surface of the first upper interlayer insulating layer 128 while also filling the gap areas 138. The conductive layer 139 may include at least one of doped polysilicon, tungsten, a metal nitride, and a metal silicide. In some embodiments, the formation of the conductive layer 139 may include sequentially forming a barrier metal layer (e.g. a metal nitride) and a metal layer (e.g. tungsten).

Referring to FIG. 6M, gate electrodes 110 and pads 120 may be formed, which are vertically separated from each other, by removing portions of the conductive layer 139 that are in the trenches 136 and that are on the first upper interlayer insulating layer 128 while leaving portions of the conductive layer 139 that are in the gap areas 138. The removal process may include an anisotropic etch process. The gate electrodes 110 may include a ground selection gate electrode 111, string selection gate electrodes 113, and cell gate electrodes 112 stacked between the ground selection gate electrode 111 and the string selection gate electrodes 113. The string selection gate electrodes 113 may include a first string selection gate electrode 113a and a second string selection gate electrode 113b. The pads 120 may include a ground selection pad 121, string selection pads 123, and cell pads 122 that are stacked in a cascade structure between the ground selection pad 121 and the string selection pads 123. In addition, the string selection pads 123 may include a first string selection pad 123a and a second string selection pad 123b. Since the conductive layer 139 is removed from the trenches 136, the upper surface of the substrate 100 may be exposed.

Referring further to FIG. 6M, the method may include forming common source areas 141 in the substrate 100 by performing an ion injection process. The common source areas 141 may be formed after the gate electrodes 110 are formed. In other embodiments, the common source areas 141 may be formed after the trenches 136 are formed but before the sacrificial layers 103 are removed. The common source areas 141 may have a line shape extending in a direction, like a horizontal shape of the trenches 136. The common source areas 141 may include N-type impurities.

Referring to FIG. 6N, the method may include forming spacers 143 on sidewalls of the trenches 136. The spacers 143 may be formed by depositing a spacer insulating layer on the entire substrate 100 and performing an anisotropic etch process. The spacers 143 may include silicon oxide, silicon nitride, silicon oxynitride, or another insulating material. The spacers 143 may cover sidewalls of the buffer insulating layer 101, the interlayer insulating layers 102 and the gate electrodes 110

Referring to FIG. 6O, common source lines 142 that are connected to the common source areas 141 may be formed by filling the trenches 136 with a conductive material such as tungsten. Next, the method may include forming a second upper interlayer insulating layer 147 on the entire surface of the device. In some embodiments, the formation of the common source line 142 may include sequentially forming a barrier metal layer (e.g. a metal nitride) and a metal layer (e.g. tungsten). The common source lines 142 may have a line shape extending in a direction along the trenches 136.

Referring to FIG. 6P, contact holes 150h may be formed that expose the pads 120 using an etch process. The etch process may include forming a photoresist pattern 149 on the second upper interlayer insulating layer 147 and patterning the capping insulating layer 127, the first and second upper interlayer insulating layers 128 and 147, and the lowermost interlayer insulating layer 102 by performing an anisotropic etch process using the photoresist pattern 149 as an etch mask. The contact holes 150h may include first contact holes 151h, second contact holes 152h, and third contact holes 153h. The first contact holes 151h may expose the first and second string selection pads 123a and 123b. The second contact holes 152h may expose the cell pads 122, respectively. The third contact holes 153h may expose the ground selection pad 121.

Since the contact holes 150h expose the pads 120 having the cascade structure, vertical lengths of the contact holes 150h may be different from each other. Accordingly, while the contact holes 150h are formed, the amount that the etchant recesses the upper surfaces of the pads 120 that are exposed at the bottoms of the contact holes 150h due to over etch may differ. More specifically, when the pads 120 are located at higher levels in the device structure (i.e., farther from the substrate 100), the portions of the pads 120 that are exposed at the bottom of the contact holes 150h are more severely attacked and damaged in the process of etching the capping insulating layer 127. Therefore, the pads 120 in shallow contact holes 150h may be more recessed than the pads 120 in deeper contact holes 150h. Further, the pads 120 in shallow contact holes 150h may be fully removed to generate borings exposing the interlayer insulating layers 102 located thereunder. According to the present embodiment of the inventive concepts, since the pads 120 are thicker than the gate electrodes 110, the aforementioned problems can be reduced or eliminated, and a margin of an etch process can be sufficiently secured.

Next, referring again to FIG. 3, the method may include forming contact plugs 150, a third upper interlayer insulating layer 162, first metal lines 160, interconnection plugs 164, a bit line 170, and a second metal line 180.

The contact plugs 150 may be formed by filling the contact holes 150h with a conductive material, such as copper or tungsten. The contact plugs 150 may include a ground selection plug 151, cell plugs 152, and first and second string selection plugs 153a and 153b. The ground selection plug 151 may penetrate the interlayer insulating layers 102, the capping insulating layer 127, and the first and second upper interlayer insulating layers 128 and 147 to contact the ground selection pad 121. The cell plugs 152 may penetrate the capping insulating layer 127 and the first and second upper interlayer insulating layers 128 and 147 to contact the cell pads 122. The string selection plugs 153a and 153b may penetrate the capping insulating layer 127 and the first and second upper interlayer insulating layers 128 and 147 to contact the first and second string selection pads 123a and 123b.

The first metal lines 160 may be aligned with the contact plugs 150 by performing a deposition process and an etch process. The first metal lines 160 may be connected to the cell plugs 152 and the ground selection plug 151, respectively.

The third upper interlayer insulating layer 162 may be formed by depositing an insulating material, such as silicon oxide, on the second upper interlayer insulating layer 147 and the first metal lines 160.

The interconnection plugs 164 may vertically penetrate the second upper interlayer insulating layer 147 and the third upper interlayer insulating layer 162 to electrically connect the vertical channel structures 130 to the bit line 170 in the cell region 20. The interconnection plugs 164 may vertically penetrate the third upper interlayer insulating layer 162 to electrically connect the first and second string selection plugs 153a and 153b to the second metal line 180 in the connection region 30. The interconnection plugs 164 may include a conductive material, such as copper or tungsten.

The bit lines 170 and the second metal lines 180 may extend horizontally on a top surface of the third upper interlayer insulating layer 162. The bit lines 170 and the second metal lines 180 may include the same material and may formed at the same time.

In the above-described method of fabricating a semiconductor device, the pads 120 that extend from the gate electrodes 110 include contact areas 55 that are thicker than the gate electrodes 110. Accordingly, when the contact holes 150h having different depths are formed, the pads 120 can be prevented from being bored due to over etch. Therefore, since an etch margin is sufficiently secured, a semiconductor device having improved reliability can be implemented.

Figure 7:
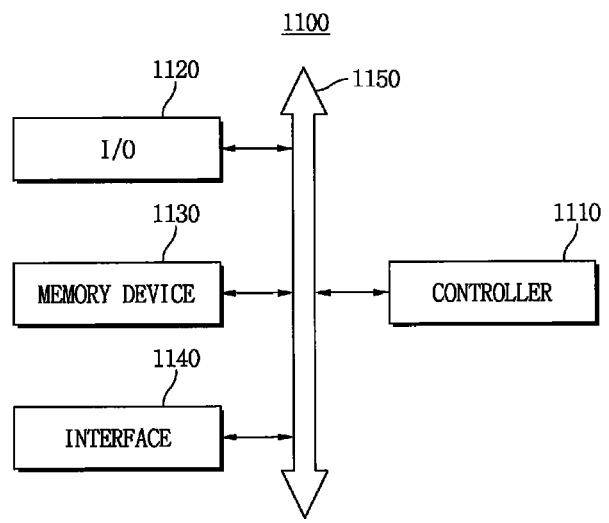
FIG. 7 is a block diagram schematically showing an electronic system including a semiconductor device in accordance with an embodiment of the inventive concepts.

FIG. 7 is a block diagram schematically showing an electronic system including a semiconductor device in accordance with an embodiment of the inventive concepts. Referring to FIG. 7, an electronic system 1100 in accordance with the embodiment of the inventive concepts may include a controller 1110, an input/output device (I/O) 1120, a memory device 1130, an interface 1140, and a bus 1150. At least two of the controller 1110, the I/O 1120, the memory device 1130, and the interface 1140 may be connected to each other through the bus 1150. The bus 1150 corresponds to a data transfer path.

The controller 1110 may include at least one of a microprocessor, a digital signal processor, a microcontroller, and other logic devices capable of performing a similar function thereof. The I/O 1120 may include a keypad, a keyboard, a display device, etc. The memory device 1130 may store data and a command, etc. The memory device 1130 may include at least one of the semiconductor devices disclosed in the above-described embodiments of the inventive concepts. In addition, the memory device 1130 may further include at least one of a phase-change random access memory (PRAM), a magnetic random access memory (MRAM), a dynamic random access memory (DRAM), and a static random access memory (SRAM). The interface 1140 may serve to transmit/receive data to/from a communication network. The interface 1140 may be a wired or wireless type. For example, the interface 1140 may include an antenna or a wired/wireless transceiver. Although not shown in FIG. 7, the electronic system 1100 may further include at least one of a high-speed DRAM and an SRAM as a working memory device for improving an operation of the controller 1110.

The electronic system 1100 may be applicable to personal digital assistants (PDAs), portable computers, web tablets, wireless phones, mobile phones, digital music players, memory cards, or any electronic devices that can transmit and/or receive information in wireless environments.

Figure 8:
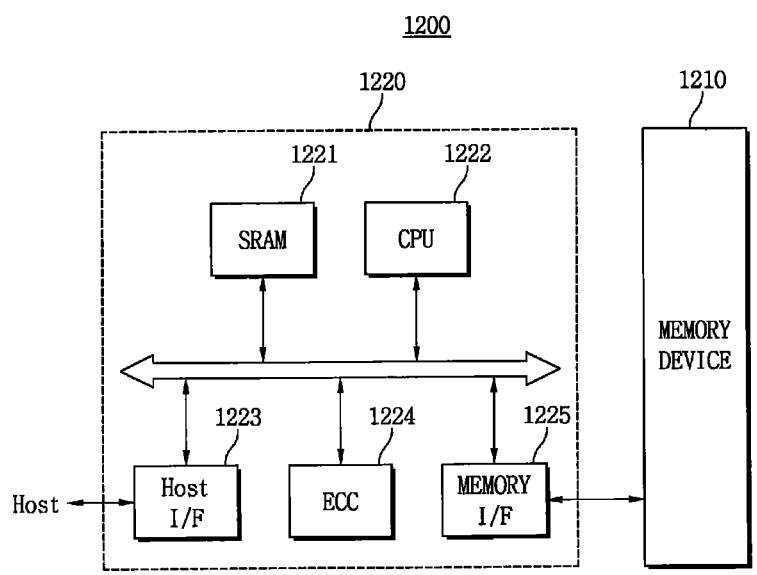
FIG. 8 is a block diagram schematically showing a memory card including a semiconductor device in accordance with an embodiment of the inventive concepts.

FIG. 8 is a block diagram schematically showing a memory card including a semiconductor device in accordance with an embodiment of the inventive concepts.

Referring to FIG. 8, a memory card 1200 in accordance with the embodiment of the inventive concepts may include a memory device 1210. The memory device 1210 may include at least one of the semiconductor devices in accordance with the aforementioned embodiments of the inventive concepts. In addition, the memory device 1210 may further include at least one of a PRAM, an MRAM, a DRAM, and an SRAM. The memory card 1200 may include a memory controller 1220 controlling data exchange between a host Host and the memory device 1210.

The memory controller 1220 may include a processing unit 1222 controlling the overall operations of the memory card. In addition, the memory controller 1220 may include an SRAM 1221 used as an operation memory of the processing unit 1222. Further, the memory controller 1220 may include a host interface 1223 and a memory interface 1225. The host interface 1223 may include a data exchange protocol between the memory card 1200 and the host Host. The memory interface 1225 may connect the memory controller 1220 and the memory device 1210. Further, the memory controller 1220 may include an error correction block (ECC) 1224. The ECC 1224 may correct an error of data read from the memory device 1210. Although not shown, the memory card 1200 may further include a read only memory (ROM) device which stores code data for interfacing with the host Host. The memory card 1200 may be used as a portable data storage card. In addition, the memory card 1200 may be implemented as a solid state disk (SSD) capable of replacing a hard disk of a computer system.

The semiconductor devices in accordance with the embodiments of the inventive concepts include pads extending from a plurality of gate electrodes stacked on a substrate and having thicker parts than the gate electrodes. Accordingly, while an etch process for forming contact holes having different depths is performed on the pads, the pads can be prevented from being bored due to over etch, and an etch margin is sufficiently secured. Therefore, a semiconductor device having improved reliability can be implemented.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the inventive concepts as defined in the claims.

What is claimed is:

1. A semiconductor device, comprising:
gate electrodes that are stacked in a vertical direction on a substrate;
vertical channel structures that penetrate the gate electrodes to electrically connect to the substrate;
conductive pads horizontally extending from the respective gate electrodes, wherein the conductive pads include a ground selection pad and a plurality of cell pads stacked above the ground selection pad; and
contact plugs including a ground selection plug electrically connected to the ground selection pad and a plurality of cell plugs electrically connected to respective ones of the cell pads;
wherein each conductive pad includes an extension area and a contact area underneath respective ones of the contact plugs,
wherein the contact areas of the cell pads are thicker than the extension areas of the cell pads in the vertical direction,
wherein the contact area of the ground selection pad has a same thickness as the extension area of the ground selection pad,
wherein each contact area of the cell pads includes a base part and a protrusion part that protrudes vertically from the base part, and
wherein an outer side surface of the base part horizontally protrudes more than an outer side surface of the protrusion part.

2. A semiconductor device, comprising:
gate electrodes that are stacked in a vertical direction on a substrate;
vertical channel structures that penetrate the gate electrodes to electrically connect to the substrate;
conductive pads horizontally extending from the respective gate electrodes, wherein the conductive pads include a ground selection pad and a plurality of cell pads stacked above the ground selection pad; and
contact plugs including a ground selection plug electrically connected to the ground selection pad and a plurality of cell plugs electrically connected to respective ones of the cell pads;
wherein each cell pad includes an extension area and a contact area underneath respective ones of the cell plugs,
wherein the contact areas of the cell pads are thicker than the extension areas of the cell pads in the vertical direction, and
wherein a portion of the extension area of one of the cell pads that is adjacent the contact area includes a recess.

3. The semiconductor device of claim 1, wherein the extension area of one of the cell pads has substantially the same thickness as the gate electrode from which one of the conductive pads horizontally extends, and wherein each outer side surface of the base part of the cell pads is reverse tapered from a top of the protrusion part towards the substrate.

4. The semiconductor device of claim 1, further comprising interlayer insulating layers disposed under each of the cell pads,
wherein each outer side surface of the base part of the cell pads is vertically aligned with an outer side surface of the interlayer insulating layer thereunder.

5. The semiconductor device of claim 1, wherein an outer side surface of the protrusion part of the cell pads is vertically aligned with an outer side surface of the base part of the cell pads.

6. The semiconductor device of claim 1, wherein the outer side surface of the base part of the conductive pads is reverse tapered from a top of the protrusion part towards the substrate, and
the outer side surface of the protrusion part of the cell pads and the outer side surface of the base part of the cell pads are smoothly continuous.

7. The semiconductor device of claim 1, wherein the gate electrodes include ground selection gate electrodes, string selection gate electrodes, and cell gate electrodes stacked between the ground selection gate electrodes and the string selection gate electrodes, and
the conductive pads further include string selection pads above the cell pads.

8. The semiconductor device of claim 1, wherein each vertical channel structure includes a vertical channel, a tunnel insulating layer, a charge storage layer, a blocking insulating layer, and a filling insulating layer.

9. The semiconductor device of claim 7, wherein the contact plugs comprise string selection plugs that are electrically connected to the respective string selection pads, ground selection plugs that are electrically connected to the respective ground selection pads, and cell plugs that are electrically connected to the respective cell pads, and
wherein a first subset of the cell plugs are collinear with at least one of the ground selection plugs while the combination of the first subset of the cell plugs and the at least one of the ground selection plugs are not collinear with any of the string selection plugs.

10. The semiconductor device of claim 1, wherein interfaces between upper surfaces and outer side surfaces of the thickened portions of the conductive pads are rounded.

* * * * *